(12) United States Patent  
Nixon et al.

(10) Patent No.: US 6,504,142 B2  
(45) Date of Patent: *Jan. 7, 2003

(54) PHOTODIODE LIGHT SENSOR

(75) Inventors: Robert H. Nixon, Burbank, CA (US); Eric R. Fossum, La Crescenta, CA (US); Jon H. Bechtel, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/057,696

(22) Filed: Jan. 25, 2002

(65) Prior Publication Data

US 2002/0100865 A1 Aug. 1, 2002

Related U.S. Application Data

(63) Continuation of application No. 09/307,191, filed on May 7, 1999, now Pat. No. 6,359,274, which is a continuation-in-part of application No. 09/237,107, filed on Jan. 25, 1999.

(51) Int. Cl.[7] .............................................. H01J 40/14
(52) U.S. Cl. ................................. 250/214 C; 250/215
(58) Field of Search ........................ 250/214 R, 214 C, 250/214.1, 215; 359/601, 602, 603, 604, 605, 606, 607, 608; 327/517

(56) References Cited

U.S. PATENT DOCUMENTS

| 4,208,668 A | 6/1980 | Krimmel |
| 4,315,159 A | 2/1982 | Niwa et al. |
| 4,465,370 A | 8/1984 | Yuasa et al. |
| 4,669,826 A | 6/1987 | Itoh et al. |
| 4,678,938 A | 7/1987 | Nakamura |
| 4,690,508 A | 9/1987 | Jacob |
| 4,697,883 A | 10/1987 | Suzuki et al. |
| 4,799,768 A | 1/1989 | Gahan |
| 4,819,071 A | 4/1989 | Nakamura |
| 4,916,307 A | 4/1990 | Nishibe et al. |
| 5,036,437 A | 7/1991 | Macks |
| 5,204,778 A | 4/1993 | Bechtel |
| 5,214,274 A | 5/1993 | Yang |
| 5,235,178 A | 8/1993 | Hegyi |
| 5,243,215 A | 9/1993 | Enomoto et al. |
| 5,338,691 A | 8/1994 | Enomoto et al. |
| 5,386,128 A | 1/1995 | Fossum et al. |
| 5,410,455 A | 4/1995 | Hashimoto |
| 5,416,318 A | 5/1995 | Hegyi |
| 5,426,294 A | 6/1995 | Kobayashi et al. |
| 5,451,822 A | 9/1995 | Bechtel et al. |
| 5,471,515 A | 11/1995 | Fossum et al. |
| 5,488,416 A | 1/1996 | Kyuma |
| 5,550,677 A | 8/1996 | Schofield et al. |
| 5,625,210 A | 4/1997 | Lee et al. |
| 5,644,418 A | 7/1997 | Woodward |
| 5,666,028 A | 9/1997 | Bechtel et al. |
| 5,712,685 A | 1/1998 | Dumas |

(List continued on next page.)

FOREIGN PATENT DOCUMENTS

| EP | 0675345 | 10/1995 |
| EP | 0711683 | 5/1996 |
| EP | 0869032 | 10/1998 |
| WO | 9735743 | 10/1997 |

*Primary Examiner*—F. L. Evans
(74) *Attorney, Agent, or Firm*—Price, Heneveld, Cooper, Dewitt & Litton

(57) ABSTRACT

Light sensors having a wide dynamic range are used in a variety of applications. A wide dynamic range light sensor includes an exposed photodiode light transducer accumulating charge in proportion to light incident over an integration period. Sensor logic determines a light integration period prior to the beginning of integration and the charge is reset. Charge accumulated by the exposed light transducer over the light integration period is measured and a pulse having a width based on the accumulated charge is determined.

26 Claims, 24 Drawing Sheets

U.S. PATENT DOCUMENTS

| | | |
|---|---|---|
| 5,760,962 A | 6/1998 | Schofield et al. |
| 5,789,737 A | 8/1998 | Street |
| 5,796,094 A | 8/1998 | Schofield et al. |
| 5,808,350 A | 9/1998 | Jack et al. |
| 5,841,126 A | 11/1998 | Fossum et al. |
| 5,841,159 A | 11/1998 | Lee et al. |
| 5,904,493 A | 5/1999 | Lee et al. |
| 6,027,955 A | 2/2000 | Lee et al. |
| 6,359,274 B1 * | 3/2002 | Nixon et al. ............ 250/214 C |

* cited by examiner

PHOTODIODE LIGHT SENSOR

CROSS-REFERENCE TO RELATED APPLICATION

This application is a continuation of U.S. patent application Ser. No. 09/307,191 filed on May 7, 1999, entitled "PHOTODIODE LIGHT SENSOR," by Robert H. Nixon et al., now U.S. Pat. No. 6,359,274, which is a continuation-in-part of U.S. patent application Ser. No. 09/237,107, filed Jan. 25, 1999, entitled "PHOTODIODE LIGHT SENSOR," now abandoned, the specifications of which are incorporated herein by reference.

TECHNICAL FIELD

The present invention relates to light sensors incorporating a charge integrating photodiode as a light transducer.

BACKGROUND ART

A light sensor generates an output-signal indicating the intensity of light incident upon the light sensor. The light sensor includes a light transducer for converting light into an electrical signal and may also include electronics for signal conditioning, compensation for cross-sensitivities such as temperature, and output signal formatting. Light sensors are used in a wide range of applications including remote sensing, communications, and controls.

One application for light sensors is in automatically dimming vehicle rearview mirrors. Vehicle operators use interior and exterior rearview mirrors to view scenes behind the vehicle without having to face in a rearward direction and to view areas around the vehicle that would otherwise be blocked by vehicle structures. As such, rearview mirrors are an important source of information to the vehicle operator. Bright lights appearing in a scene behind the vehicle, such as from another vehicle approaching from the rear, may create glare in a rearview mirror that can temporarily visually impair or dazzle the operator. This problem is generally worsened during conditions of low ambient light, such as those that occur at night, when the eyes of the vehicle operator have adjusted to the darkness.

Automatically dimming rearview mirrors eliminate the need for the operator to manually switch the mirror. The earliest designs used a single glare sensor facing rearward to detect the level of light striking the mirror. This design proved to be inadequate since the threshold perceived by the operator for dimming the mirror, known as the glare threshold, varied as a function of the ambient light level. An improvement included a second light sensor for detecting the ambient light level. The glare threshold in these systems is based on the amount of ambient light detected. Among the dual sensor designs proposed include those described in U.S. Pat. Nos. 3,601,614 to Platzer; 3,746,430 to Brean et al.; 4,580,875 to Bechtel et al.; 4,793,690 to Gahan et al.; 4,886,960 to Molyneux et al.; 4,917,477 to Bechtel et al.; 5,204,778 to Bechtel; 5,451,822 to Bechtel et al.; and 5,715,093 to Schierbeek et al., each of which is incorporated herein by reference.

A key element in the design of an automatic dimming mirror is the type of light transducer used to implement ambient light and glare detection. A primary characteristic of interest in selecting a light transducer type is the dynamic range. The ratio between the intensity of bright sunlight and moonlight is roughly 1,000,000:1, indicating the wide range that must be sensed by the ambient light sensor. Both the ambient light and the glare light sensors must operate within the ranges of temperature, humidity, shock, and vibration experienced within a vehicle passenger compartment. If a sensor is to be mounted in an outside mirror, even harsher operating conditions can be expected. Sensors and support electronics must also be inexpensive to allow the cost of an automatically dimmed mirror to fall within the range deemed acceptable by an automobile purchaser. Transducers should have good noise immunity or be compatible with noise compensation electronics within the sensor for sensitivity at low light levels. Transducers should further have a spectral response similar to the frequency response of the human eye. As a final desirable characteristic, the sensor must be easily integratable into the types of digital control systems commonly found in automotive applications.

Photodiode light sensors incorporate a silicon-based photodiode and conditioning electronics on a single substrate. The photodiode generates charge at a rate proportional to the amount of incident light. This light-induced charge is collected over an integration period. The resulting potential indicates the level of light to which the sensor is exposed over the integration period. Light sensors with integral charge collection have many advantages. By varying the integration time, the sensor dynamic range is greatly extended. Also, the ability to incorporate additional electronics on the same substrate as the photodiode increases noise immunity and permits the sensor output to be formatted for use by a digital circuit. Component integration additionally reduces the system cost. Silicon light sensors are relatively temperature invariant and can be packaged to provide the necessary protection from humidity, shock, and vibration. One disadvantage of silicon-based light transducers is a frequency response different from that of the human eye. A variety of charge integrating photodiode devices have been described including those in U.S. Pat. Nos. 4,916,307 to Nishibe et al.; 5,214,274 to Yang; 5,243,215 to Enomoto et al.; 5,338,691 to Enomoto et al.; and 5,789,737 to Street, each of which is incorporated herein by reference.

One difficulty with all types of light sensors is the occurrence of operating anomalies at high temperatures. Some devices become extremely non-linear at high temperatures. Some devices may suffer a permanent change in operating characteristics. Devices may even provide completely false readings such as indicating bright light in low light conditions due to excessive thermal noise. Traditionally, the only way to deal with this problem has been to incorporate a temperature sensor and associated electronics into systems that use light sensors.

What is needed is a light sensor with a wide dynamic range that may be incorporated into cost sensitive digital systems such as automatically dimming rearview mirrors. The light sensor should compensate for temperature cross-sensitivity and, preferably, provide an indication of light sensor temperature. A charge integrating light sensor having an externally determined integration period is also desirable.

DISCLOSURE OF INVENTION

It is an object of the present invention to provide a charge integrating light sensor with a wide dynamic range.

Another object of the present invention is to provide a packaged light sensor that is economical to produce.

Still another object of the present invention is to provide a charge integrating light sensor that will easily interface to digital electronics.

Yet another object of the present invention is to provide a charge integrating light sensor with an output signal indicating incident light intensity and sensor temperature.

A further object of the present invention is to provide a charge integrating light sensor with an externally determined integration period.

In carrying out the above objects and other objects and features of the present invention, a light sensor is provided. The light sensor includes an exposed photodiode light transducer accumulating charge in proportion to light incident over an integration period. Sensor logic determines the light integration period prior to the beginning of integration. The charge accumulated in the exposed light transducer at the beginning of the light integration period is reset. The charge accumulated by the exposed light transducer over the light integration period is measured and a pulse having a width based on the accumulated charge is determined.

In an embodiment of the present invention, the light sensor includes a comparator with one input connected to the exposed light transducer and the other input connected to a switched capacitor circuit. The switched capacitor circuit charges a capacitor to a fixed voltage when the switch is closed and discharges the capacitor at a constant rate when the switch is open. The sensor logic closes the switch during the light integration period and opens the switch after the light integration period, thereby creating the pulse at the comparator output. In a refinement, the light sensor further includes a second comparator with one input connected to a fixed voltage and the other input connected to the switched capacitor circuit. The second comparator output inhibits output of the determined pulse if the ramp voltage is less than the fixed voltage.

In another embodiment of the present invention, the light sensor includes a photodiode light transducer shielded from light. The shielded light transducer accumulates charge in proportion to noise over the integration period. The sensor logic resets charge accumulated in the shielded light transducer at the beginning of the light integration period. Charge accumulated by the shielded light transducer over the light integration period is measured and an output pulse having a width based on the difference between the exposed light transducer charge and the shielded light transducer charge is determined.

In still another embodiment of the present invention, the light sensor has an input for receiving an integration signal. Since the noise is dependent on the light sensor temperature, the output pulse can be used to indicate sensor temperature. The output pulse is sent following the end of the received integration signal after a length of time based on the noise level.

In yet other embodiments of the present invention, the light integration period may be determined from the asserted portion of a control signal received by the sensor logic or may be determined within the sensor control by cycling through a sequence of predetermined time periods.

In a further embodiment of the present invention, the light sensor includes at least one additional exposed photodiode light transducer. Each additional exposed light transducer accumulates charge in proportion to light incident over an integration period at a rate different from the rate of any other exposed light transducer. The sensor logic outputs a pulse having a width based on the accumulated charge for each of the additional exposed light transducers. In one refinement, each exposed light transducer has a different collector area. In another refinement, each exposed light transducer has an aperture with a different light admitting area.

A light sensor package is also provided. The package includes an enclosure having a window for receiving light. The enclosure admits a power pin, a ground pin, and an output pin. Within the enclosure, an exposed photodiode light transducer accumulates charge in proportion to light received through the window incident over the integration period. A light-to-voltage circuit outputs a light voltage signal based on charge accumulated by the exposed light transducer. A voltage-to-pulse circuit outputs a pulse on the output pin. The width of the pulse is based on the light voltage signal.

A light sensor with a photodiode overlaying a substrate is also provided. The photodiode accumulates charge generated by light incident on the photodiode in a photodiode well formed in a region of the substrate underlying the photodiode. The photodiode has an intrinsic photodiode capacitance. A floating diffusion having an intrinsic floating diffusion capacitance is also formed in the substrate. The floating diffusion has a diffusion well formed in a region of the substrate underlying the floating diffusion when the charge is reset. The floating diffusion eliminates charge in the diffusion well when the charge is reset. The floating diffusion charge determines an output potential. A transmission gate having an intrinsic transmission gate capacitance is placed between the photodiode and the floating diffusion. The transmission gate forms a transmission well in a region of the substrate between the region of the substrate underlying the photodiode and the region of the substrate underlying the floating diffusion. The transmission well has a depth shallower than the photodiode well and the diffusion well. When the charge is reset, charge in the photodiode well above the depth of the transmission well flows through the transmission well, through the floating diffusion, and is eliminated. During a light integration period, charge produced by light incident on the photodiode flows through the transmission well and into the diffusion well, producing output voltage inversely proportional to the floating diffusion capacitance. Once the diffusion well is filled to the depth of the transmission well, charge produced by light incident on the photodiode fills the photodiode well, the transmission well, and the diffusion well, producing output voltage inversely proportional to the sum of the floating diffusion capacitance, the photodiode capacitance, and the transmission gate capacitance. This dual capacitance provides a first sensitivity during charge accumulation in the diffusion well only and a second sensitivity during charge accumulation in the diffusion well, the transmission well, and the photodiode well. The first sensitivity is greater than the second sensitivity.

In an embodiment, the light sensor includes an anti-bloom gate between the photodiode and a source voltage diffusion. The anti-bloom gate defines an anti-blooming well formed in a region of the substrate between the region of the substrate underlying the photodiode and the source voltage diffusion. The anti-blooming well has a depth shallower than the transmission well.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
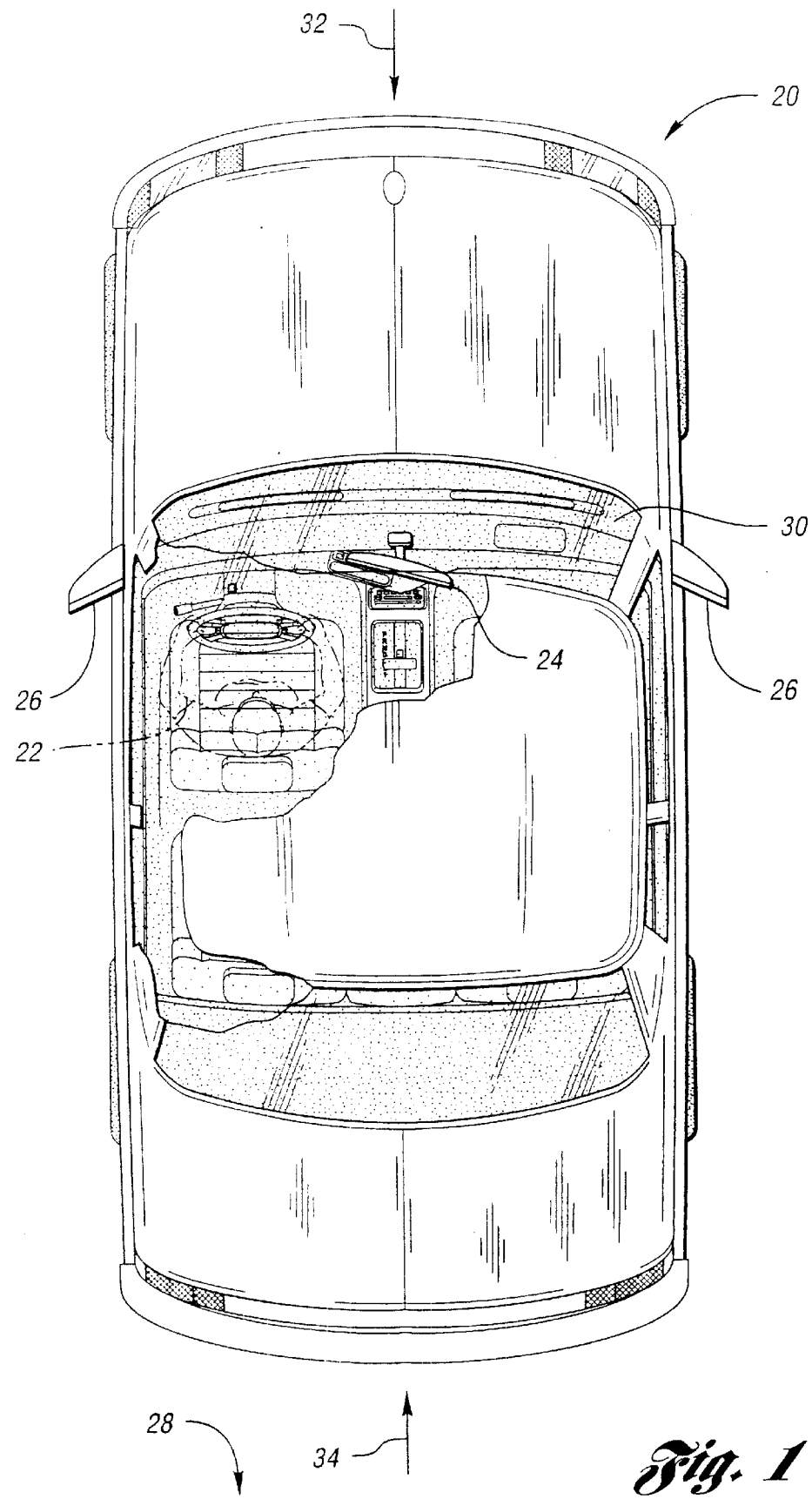
FIG. 1 is a drawing illustrating vehicle rearview mirrors that may incorporate the present invention.

Referring now to FIG. 1, a drawing illustrating vehicle rearview mirrors that may incorporate the present invention is shown. Vehicle 20 is driven by operator 22. Operator 22 uses interior rearview mirror 24 and one or more exterior rearview mirrors 26 to view a rearward scene, shown generally by 28. Most of the time, operator 22 is looking forward through windshield 30. The eyes of operator 22 therefore adjust to ambient light 32 coming from a generally forward direction. A relatively bright light source in rearward scene 28 may produce light which can reflect from mirrors 24, 26 to temporarily visually impair, distract, or dazzle operator 22. This relatively strong light is known as glare 34.

To reduce the impact of glare 34 on operator 22, the reflectance of mirrors 24, 26 may be reduced. Prior to automatically dimming mirrors, interior rearview mirror 24 would contain a prismatic reflective element that could be manually switched by operator 22. Automatically dimming mirrors include a sensor for glare 34 and, typically, for ambient light 32, and dim one or more mirrors 24, 26 in response to the level of glare 34.

Figure 2:
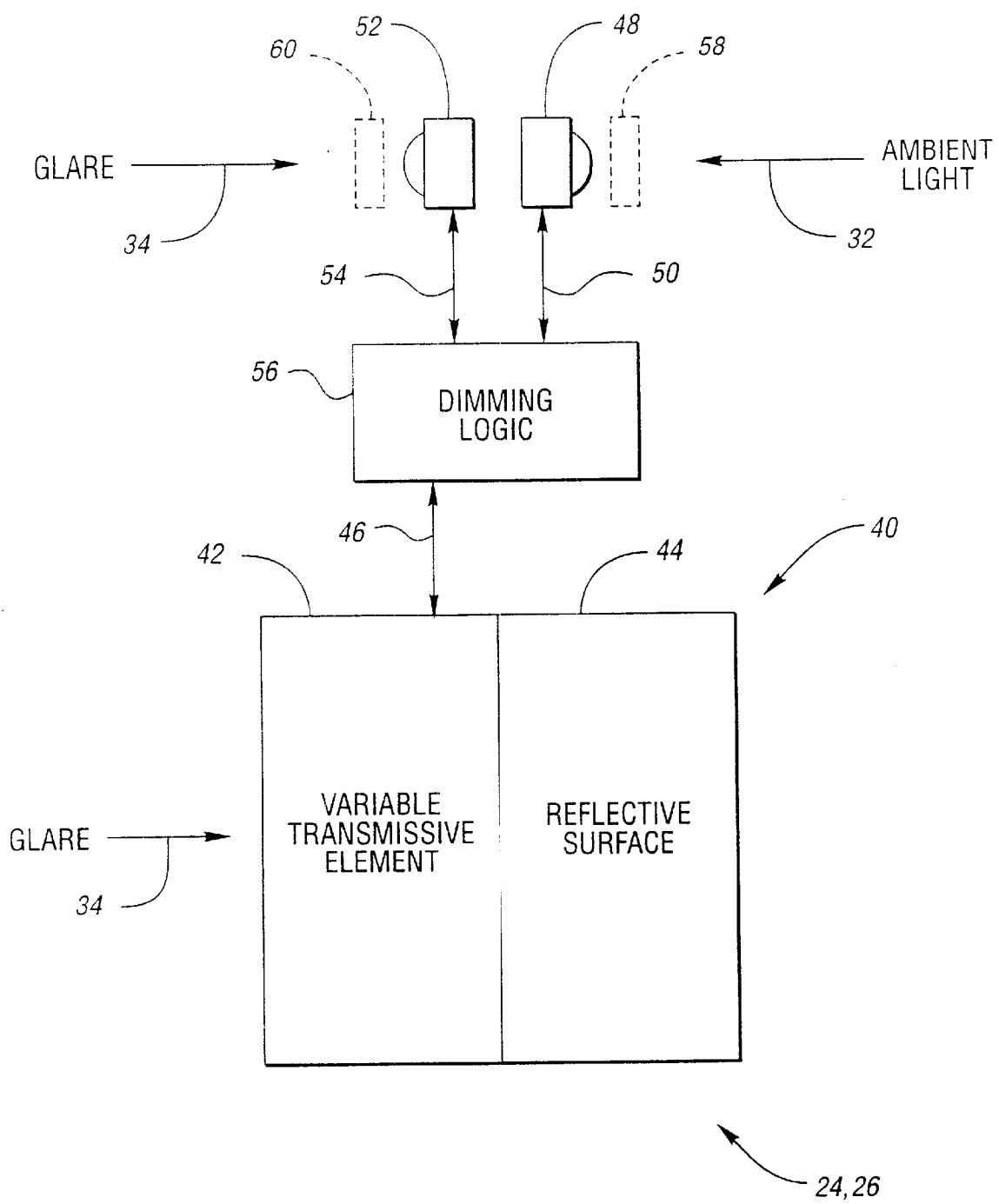
FIG. 2 is a block diagram of an embodiment of the present invention.

Referring now to FIG. 2, a block diagram of an embodiment of the present invention is shown. A dimming element, shown generally by 40, includes variable transmittance element 42 and reflective surface 44. Dimming element 40 is positioned such that reflective surface 44 is viewed through variable transmittance element 42. Dimming element 40 exhibits variable reflectance of light in response to dimming element control signal 46. Ambient light sensor 48 is positioned to receive ambient light 32 from generally in front of vehicle 20. Ambient light sensor 48 produces discrete ambient light signal 50 indicating the amount of ambient light 32 incident on ambient light sensor 48 over an ambient light integration period. Glare sensor 52 is positioned to detect glare 34 from generally behind vehicle 20 and may optionally be placed to view glare 34 through variable transmittance element 42. Glare sensor 52 produces discrete glare signal 54 indicating the amount of glare 34 incident on glare sensor 52 over a glare integration period. Dimming logic 56 receives ambient light signal 50 and determines an ambient light level. Dimming logic 56 determines the glare integration period based on the level of ambient light 32. Dimming logic 56 receives glare signal 54 and determines the level of glare 34. Dimming logic 56 outputs dimming element control signal 46, setting the reflectance of dimming element 40 to reduce the effects of glare 34 perceived by operator 22.

Either glare sensor 52, ambient light sensor 48 or, preferably, both are semiconductor light sensors with integral charge collection. Such sensors include light transducers which convert incident light into charge. This charge is collected over an integration period to produce a potential which is converted by sensor 48, 52 into a discrete output. Designs suitable for this application are described in U.S.

Pat. No. 4,916,307 entitled "LIGHT INTENSITY DETECTING CIRCUIT WITH DARK CURRENT COMPENSATION" by Nishibe et al.; and U.S. Pat. No. 5,214,274 entitled "IMAGE SENSOR ARRAY WITH THRESHOLD VOLTAGE DETECTORS AND CHARGED STORAGE CAPACITORS" to Yang; each of which is incorporated herein by reference. Preferred embodiments for light sensors 48, 52 are described with regard to FIGS. 13–33 below.

One difficulty with silicon-based sensors is the difference in spectral sensitivity between silicon and the human eye. Ambient light filter 58 may be placed before or incorporated within ambient light sensor 50. Similarly, glare filter 60 may be placed before or incorporated within glare sensor 52. Filters 58, 60 attenuate certain portions of the spectrum that may include visible light, infrared, and ultraviolet radiation such that light striking sensors 48, 52 combine with the frequency response of light transducers within sensors 48, 52 to more closely approximate the response of the human eye and to compensate for tinting in vehicle windows such as windshield 30. The use of filters 58, 60 to compensate for the spectral sensitivity of light transducers within sensors 48, 52 is described with regards to FIGS. 31–33 below.

Variable transmittance element 42 may be implemented using a variety of devices.

Dimming may be accomplished mechanically as described in U.S. Pat. No. 3,680,951 entitled "PHOTOELECTRICALLY-CONTROLLED REAR-VIEW MIRROR" to Jordan et al.; and U.S. Pat. No. 4,443,057 entitled "AUTOMATIC REARVIEW MIRROR FOR AUTOMOTIVE VEHICLES" to Bauer et al.; each of which is incorporated herein by reference. Variable transmittance element 42 may be formed using liquid crystal cells as is described in U.S. Pat. No. 4,632,509 entitled "GLARE-SHIELDING TYPE REFLECTOR" to Ohmi et al., which is incorporated herein by reference. Preferably, variable transmittance element 42 is an electrochromic cell which varies transmittance in response to an applied control voltage such as is described in U.S. Pat. No. 4,902,108 entitled "SINGLE-COMPARTMENT, SELF-ERASING, SOLUTION-PHASE ELECTROCHROMIC DEVICES, SOLUTIONS FOR USE THEREIN, AND USES THEREOF" to Byker, which is incorporated herein by reference. Many other electrochromic devices may be used to implement dimming element 40, some of which are mentioned in the Background Art section of this application. As will be recognized by one of ordinary skill in the art, the present invention does not depend on the type or construction of dimming element 40. If dimming element 40 includes electrochromic variable transmittance element 42, reflective surface 44 may be incorporated into variable transmittance element 42 or may be external to variable transmittance element 42.

Each interior rearview mirror 24 and exterior rearview mirror 26 must include dimming element 40 for automatic dimming. Preferably, interior rearview mirror 24 also includes dimming logic 56, light sensors 48, 52, and, if used, filters 58 and 60. Various embodiments for controlling exterior rearview mirrors 26 are described with regard to FIG. 6 below.

Figure 3:
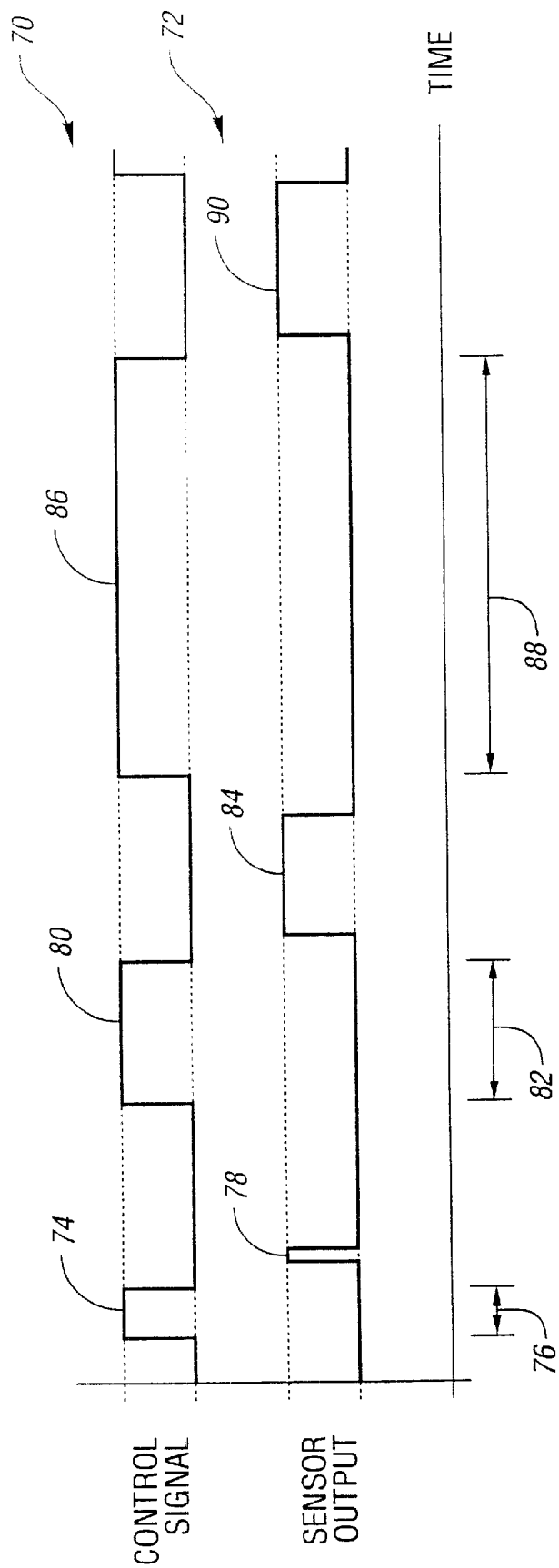
FIG. 3 is a timing diagram illustrating integration control and sensor output for a light sensor that may be used to implement the present invention.

Referring now to FIG. 3, a timing diagram illustrating integration control and sensor output for a light sensor that may be used to implement the present invention is shown. Charge accumulating light sensors 48, 52 exhibit increased dynamic range through variable integration periods. A control signal, shown generally by 70, is used to specify the integration period. The resulting sensor output, shown generally by 72, includes an output pulse for each integration period. The total amount of light-induced charge which can be effectively measured is limited. Therefore, in the presence of bright light, a short integration time is desirable to prevent saturation. However, if a short integration time is used in low light conditions, the charge signal may be lost in noise inherent in sensor 48, 52.

Control signal 70 includes a sequence of integration periods having varying lengths. In the example shown in FIG. 3, short integration pulse 74 having short integration period 76 is generated. A semiconductor light sensor may output a short pulse in a completely dark environment due to noise. Therefore, any pulse in sensor output 72, such as short signal pulse 78, having a duration less than a threshold is ignored. Next, medium integration pulse 80 having medium integration period 82 is generated. Resulting medium signal pulse 84 has a duration indicative of the amount of light incident on sensor 48, 52 during medium integration period 82. Long integration pulse 86 having long integration period 88 is generated. If light sensor 48,52 is sufficiently bright, saturation will result. Therefore, long signal pulse 90 having a duration greater than a threshold is also ignored.

Control signal 70 may be generated outside of light sensor 48, 52 or may be generated by control logic within light sensor 48, 52. If generated externally, control signal 70 and sensor output 72 may share a common signal line or may use separate signal lines. Various options and embodiments are described with regard to FIGS. 4–28 below.

Figure 4:
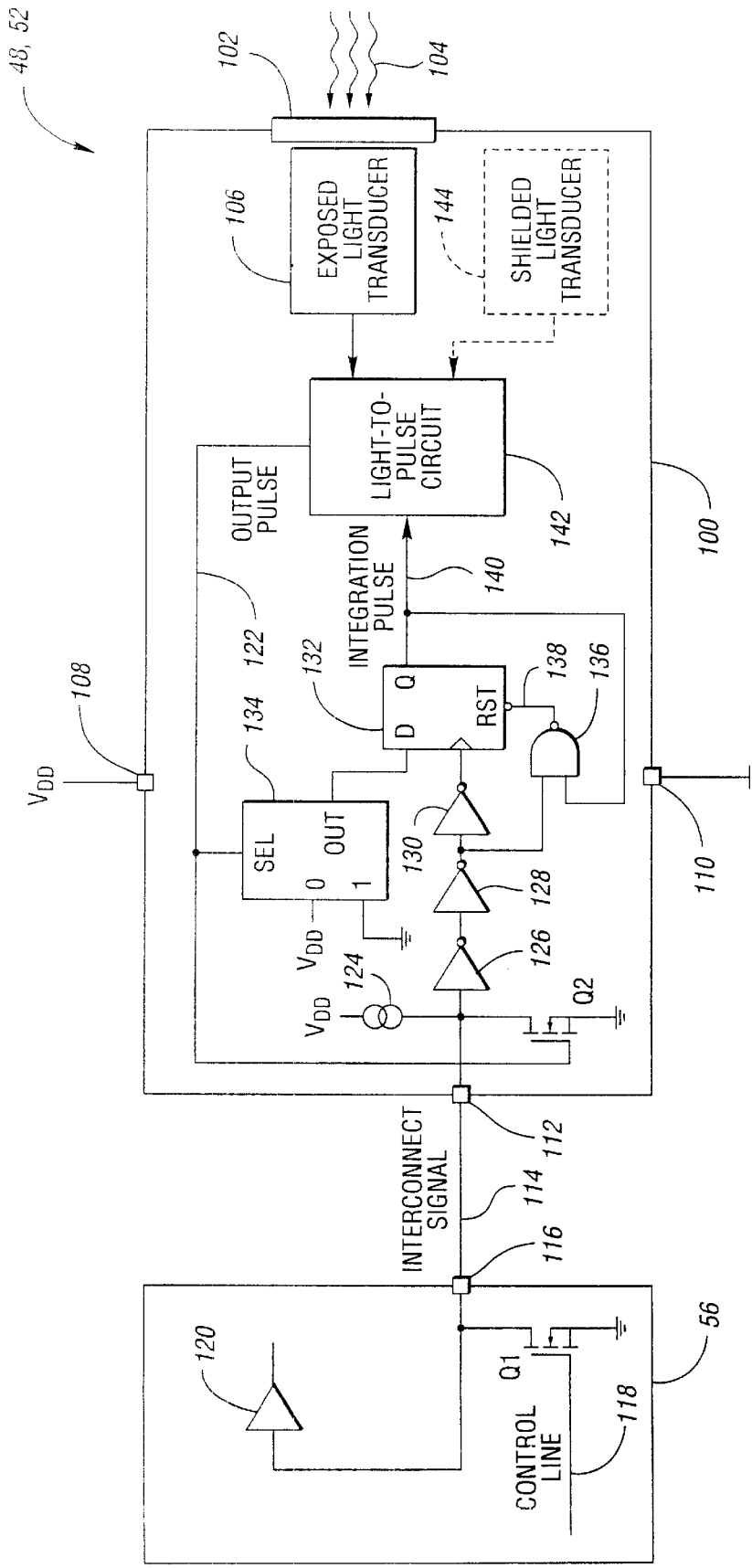
FIG. 4 is a schematic diagram of circuitry permitting dimming logic and a light sensor to be interconnected by a single line carrying both integration control and sensor output.

Referring now to FIG. 4, a schematic diagram of circuitry permitting dimming logic and a light sensor to be interconnected by a single line carrying both integration control and sensor output is shown. Light sensor 48, 52 include enclosure 100 with window 102 admitting light 104 incident on exposed light transducer 106. Enclosure 100 admits power pin 108, ground pin 110, and signal pin 112. The use of only three pins 108, 110, 112 greatly reduces the cost of light sensor 48, 52. A three-pin package that may be used to implement light sensor 48, 52 is described with regards to FIG. 28 below.

Light sensor 48, 52 is connected to dimming logic 56 through interconnection signal 114 between signal pin 112 in light sensor 48, 52 and signal pin 116 in dimming logic 56. As will be described below, signal pins 112, 116 are tri-state ports permitting interconnect signal 114 to provide both an input to light sensor 48, 52 and an output from light sensor 48, 52. Dimming logic 56 may include FET Q1 connected between signal pin 116 and ground. FET Q1 is controlled by control line 118 connected to the base of Q1. Buffer 120 is also connected to signal pin 116.

Within light sensor 48, 52, FET Q2 is connected between signal pin 112 and ground. FET Q2 is controlled by output pulse 122 connected to the gate of Q2. Constant current source 124 is connected to signal pin 112 so that if neither Q1 nor Q2 are on, interconnect signal 114 is pulled high. Constant current source 124 nominally sources about 0.5 mA to pull up interconnect signal 114. The input of Schmidt trigger inverter 126 is connected to signal pin 112. Schmidt trigger inverter 126 is followed by inverters 128 and 130 in series. The output of inverter 130 clocks D flip-flop 132. The output of multiplexer 134 is connected to the D input of flip-flop 132. The select input of multiplexer 134 is driven by output pulse 122 such that when output pulse 122 is asserted, the D input of flip-flop 134 is unasserted and when output pulse 122 is not asserted, the D input of flip-flop 134 is asserted. The output of NAND gate 136 is connected to low asserting reset 138 of flip-flop 132. The output of flip-flop 132 is integration pulse 140.

Integration pulse 140 and the output of inverter 128 are inputs to NAND gate 136. Light-to-pulse circuit 142 accepts integration pulse 140 and the output of exposed light transducer 106 and produces output pulse 122. Embodiments for light-to-pulse circuit 142 are described with regard to FIGS. 13–17 and 23–27 below.

In a preferred embodiment, light sensor 48, 52 include shielded light transducer 144 which does not receive light 104. Light-to-pulse circuit 142 uses the output of shielded light transducer 144 to reduce the effects of noise in exposed light transducer 106.

Figure 5:
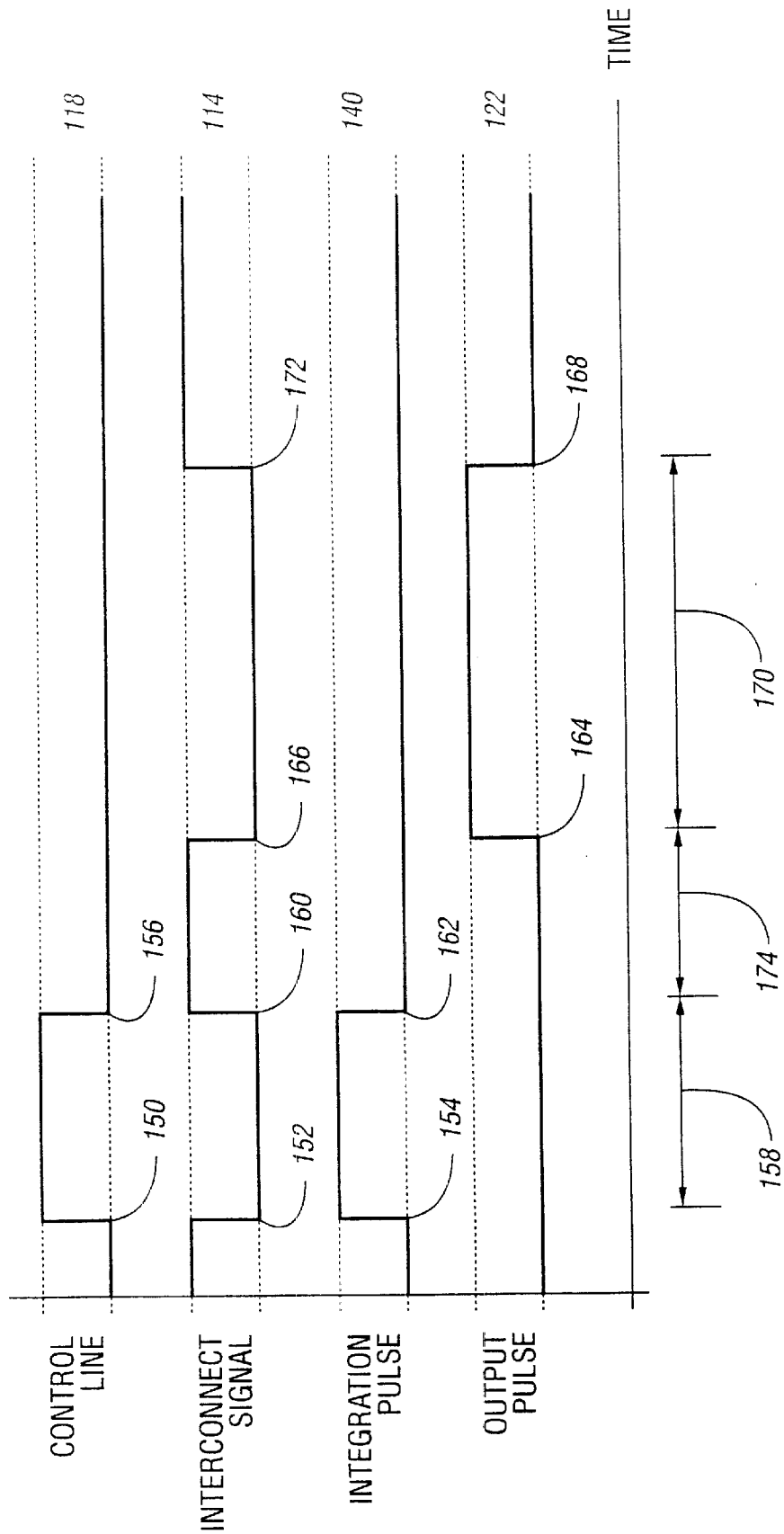
FIG. 5 is a timing diagram illustrating operation of the circuitry of FIG. 4.

Referring now to FIG. 5, a timing diagram illustrating operation of the circuitry of FIG. 4 is shown. Initially, low asserting interconnect signal 114 is high. The state of flip-flop 132 must be zero for, if the state is one, both inputs to NAND gate 136 would be high, asserting reset 138 and forcing the state of flip-flop 132 to zero.

At time 150, dimming logic 56 asserts control line 118 turning transistor Q1 on. Interconnect signal 114 is then pulled low at time 152. The output of inverter 130 transitions from low to high setting the state of flip-flop 132 to one which causes integration pulse 140 to become asserted at time 154. Light-to-pulse circuit 142 begins integrating light 104 incident on exposed light transducer 106. At time 156, control line 118 is brought low turning transistor Q1 off. The difference between time 156 and time 150 is integration period 158 requested by dimming logic 56. Since both Q1 and Q2 are off, interconnect signal 114 is pulled high by current source 124 at time 160. Since the output of inverter 128 and integration pulse 140 are both high, reset 138 is asserted causing the state of flip-flop 132 to change to zero and integration pulse 140 to become unasserted at time 162. This signals light-to-pulse circuit 142 to stop integrating light 104 incident on exposed light transducer 106.

At time 164, light-to-pulse circuit 142 asserts output pulse 122 to begin outputting light intensity information. Asserting output pulse 122 turns transistor Q2 on, pulling interconnect signal 144 low at time 166. This causes inverter 130 to output a low-to-high transition clocking a zero as the state of flip-flop 132. Light-to-pulse circuit 142 deasserts output pulse 122 at time 168. The difference between time 168 and time 164 is light intensity period 170 indicating the amount of light 104 incident on exposed light transducer 106 over integration period 158. Transistor Q2 is turned off when output pulse 122 goes low at time 168. Since both transistors Q1 and Q2 are off, interconnect signal 114 is pulled high at time 172. Buffer 120 in dimming logic 56 detects the transitions in interconnect signal 114 at times 166 and 172. The difference in time between times 172 and 166 is used by dimming logic 56 to determine the intensity of light 104 received by light sensor 48, 52.

If shielded light transducer 144 is included in light sensor 48, 52, the difference in time between the deassertion of integration pulse 140 at time 162 and the assertion of output pulse 122 at time 164 is due, in part, to the thermal noise in light sensor 48, 52. This difference is expressed as thermal noise period 174. Thermal noise period 174 may be used by dimming logic 56 to determine the temperature of light sensor 48, 52 or may be more simply used to determine if the noise level in sensor 48, 52 is too high for a reliable reading. Dimming logic 56 may disable automatic dimming of dimming element 40 if the temperature of light sensor 48,52 exceeds a preset limit. The ability of light sensor 48, 52 to use the output from shielded light transducer 144 to generate output pulse 122 indicative of the amount of thermal noise in light sensor 48, 52 is described with regard to FIGS. 15–17 below.

Figure 6:
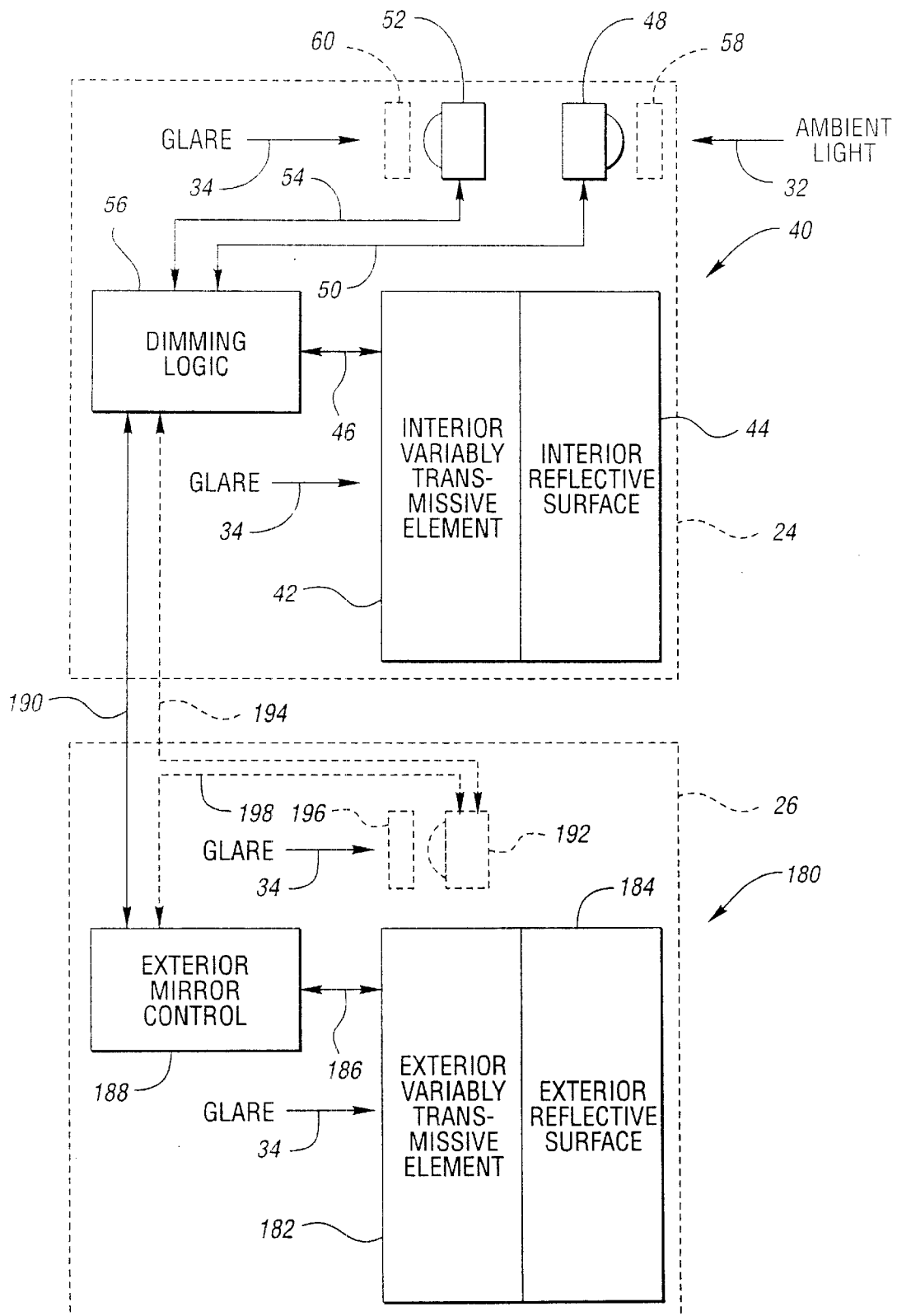
FIG. 6 is a block diagram of a rearview mirror system with interior and exterior rearview mirrors according to embodiments of the present invention.

Referring now to FIG. 6, a block diagram of a rearview mirror system with interior and exterior rearview mirrors according to embodiments of the present invention is shown. Dimming element 40 in interior rearview mirror 24 operates as described with regard to FIG. 2 above. Each exterior rearview mirror 26 includes exterior dimming element 180 having exterior variable transmittance element 182 operative to attenuate light from rearward scene 28 both prior to and after reflecting from exterior reflective surface 184. Exterior dimming element 180 provides variable reflectance based on exterior dimming element control signal 186. Exterior dimming element 180 may operate in any manner described with regard to dimming element 40 and, preferably, is an electrochromic mirror. Exterior mirror control 188 generates exterior dimming element control signal 186. Exterior mirror control 188 may be part of exterior rearview mirror 26, interior rearview mirror 24, or may be located outside of any mirror 24, 26. Various embodiments for controlling exterior dimming element 180 depend on the amount of sensing and control to be included within exterior rearview mirror 26.

In one embodiment, dimming logic 56 in interior rearview mirror 24 determines exterior dimming element control signal 186 based on output from ambient light sensor 48 and glare sensor 52. Exterior dimming element control signal 186 may be generated directly by dimming logic 56 or exterior mirror control 188 may generate exterior dimming element control signal 186 based on a reflectance level calculated in dimming logic 56 and transmitted to exterior mirror control 188 through inter-mirror signal 190.

In another embodiment, exterior rearview mirror 26 includes exterior glare sensor 192 positioned to receive glare 34 from rearward scene 28 and operative to output exterior glare signal 194 based on the amount of glare 34 incident on glare sensor 192 over a glare integration period. Since light sensors 48, 52 with silicon-based charge accumulating transducers 106, 144 have a lower cross-sensitivity to temperature, mounting light sensors 48, 52 outside the body of vehicle 20 is more practical than with other types of light transducers. Dimming logic 56 uses exterior glare signal 194 and ambient light signal 50 to determine the reflectance level for exterior dimming element 180. Again, exterior dimming element control signal 186 may be generated directly by dimming logic 56 or may be developed by exterior mirror control 188 based on the reflectance level contained in inter-mirror signal 190. Exterior glare filter 196, similar to glare filter 60, may be placed before exterior glare sensor 192 or built into exterior glare sensor 192 to provide exterior glare sensor 192 with a response closer to the response of the human eye. Inter-mirror signal 190 and exterior glare signal 194 may be in the form of a pulse width modulated signal, pulse density signal, serial data stream, or digitized and communicated over an automotive bus such as the CAN bus.

In still another embodiment, exterior glare sensor 192 produces exterior glare signal 198 which is routed directly to exterior mirror control 188. Exterior mirror control 188 determines exterior dimming element control signal 186 based on exterior glare signal 198 and the level of ambient light 32 determined by dimming logic 56 and sent to exterior mirror control 188 through inter-mirror signal 190.

In yet another embodiment, exterior rearview mirror 26 determines reflectance for exterior dimming element 180 independent of glare 34 or ambient light 32 sensed by interior rearview mirror 24. In this embodiment, exterior rearview mirror 26 operates as described with regard to FIG. 2 above.

Figure 7:
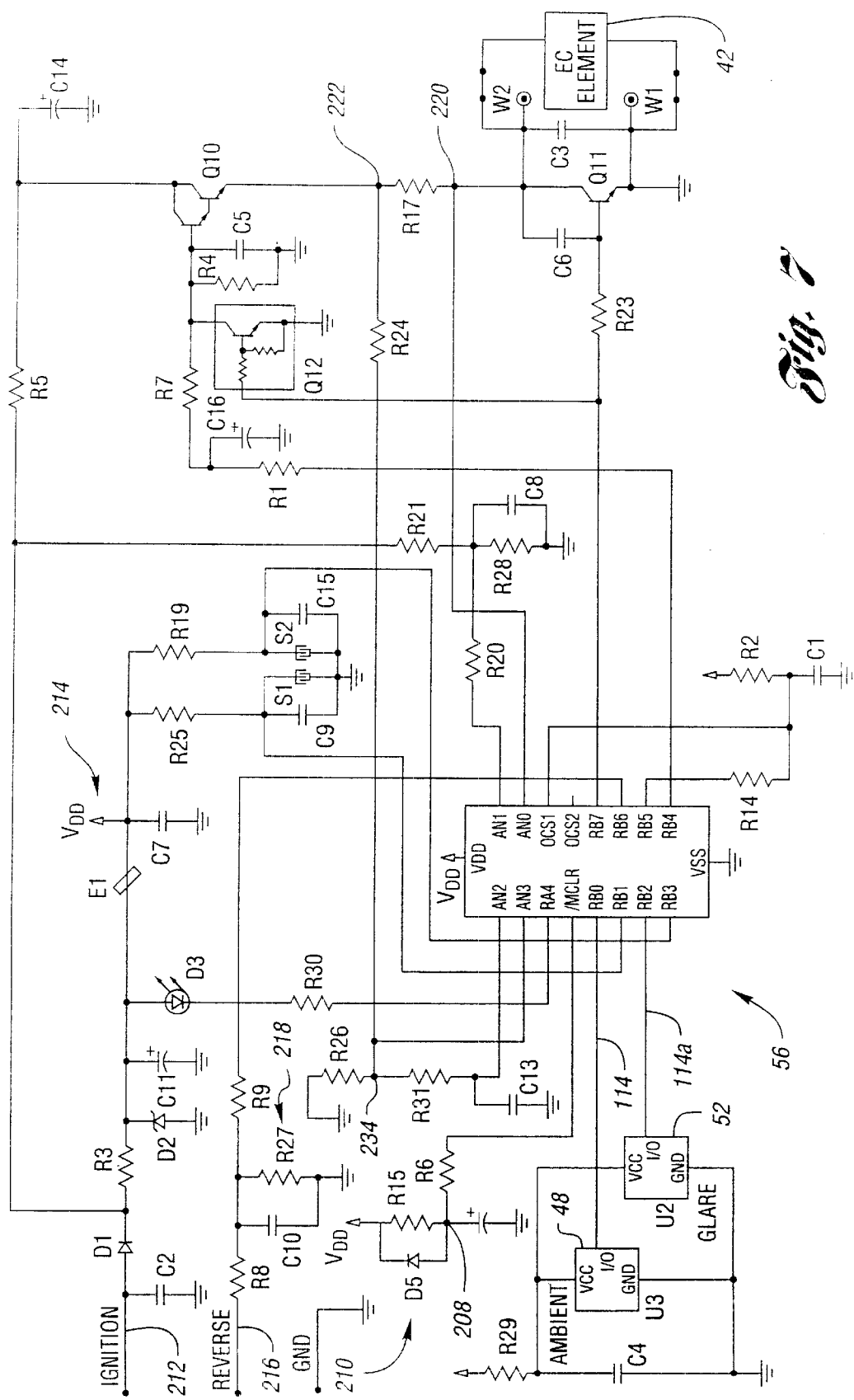
FIG. 7 is a schematic diagram illustrating an embodiment of the dimming logic.

Referring now to FIG. 7, a schematic diagram illustrating an embodiment of the dimming logic is shown. The circuit represents an effective yet inexpensive implementation for automatically dimming interior rearview mirror 24. Dimming logic 56 utilizes a small, low cost microcontroller, indicated by U1, such as the PIC16C620 from Microchip Technology, Inc. of Chandler, Arizona. Ambient light sensor 48 communicates with microcontroller U1 through interconnection signal 114 connected to microcontroller input RB0. Similarly, glare sensor 52 communicates with microcontroller U1 through separate interconnection signal 114a connected to microcontroller input RB2. As described with regard to FIGS. 4 and 5 above, each interconnection signal 114 carries integration period 158 from microcontroller U1 to light sensor 48, 52 as well as light intensity period 170 from light sensor 48, 52 to microcontroller U1. Resistor R29 and capacitor C4 connected between $V_{DD}$ and ground provide filtered power for light sensors 48, 52.

Parallel resistor R15 and diode D5 are connected between $V_{DD}$ and node 208. Capacitor C12 is connected between node 208 and ground. Resistor R6 connects common node 208 to input /MCLR of microcontroller U1. Components D5, R15, R6, and C12 form a power-on reset circuit shown generally by 210. Power is supplied to dimming logic 56 through ignition line 212. Diode D1 protects from reversed polarity on ignition line 212 and diode D2 clamps the voltage derived from ignition line 212 to approximately five volts. Capacitors C2, C7, and C11, resistor R3, and ferrite element E1 form a power conditioning circuit shown generally by 214. Reverse line 216 is asserted when vehicle 20 is placed into reverse. Capacitor C10 and resistors R8, R9, and R27 form a reverse signal conditioning circuit, shown generally by 218. Reverse signal conditioning circuit 218 low pass filters reverse line 216 and provides electrostatic discharge protection for digital input pin RB6 on microcontroller U1. Microcontroller U1 uses the signal on reverse line 216 to clear variable transmittance element 42 whenever vehicle 20 is placed in reverse. Microcontroller U1 is clocked by an RC oscillator formed by resistor R2 connected between the OSC1 pin and $V_{DD}$ and capacitor C1 connected between the OSC1 pin and ground. Resistor R30 and LED D3 connected in series between $V_{DD}$ and open drain output RA4 of microcontroller U1 form an indicator lamp that may be mounted on interior rearview mirror 24 to alert operator 22 of the operating state of dimming logic 56. Switches S1 and S2 are connected to digital inputs RB1 and RB3, respectively, of microcontroller U1 to permit selecting control options.

Figure 8:
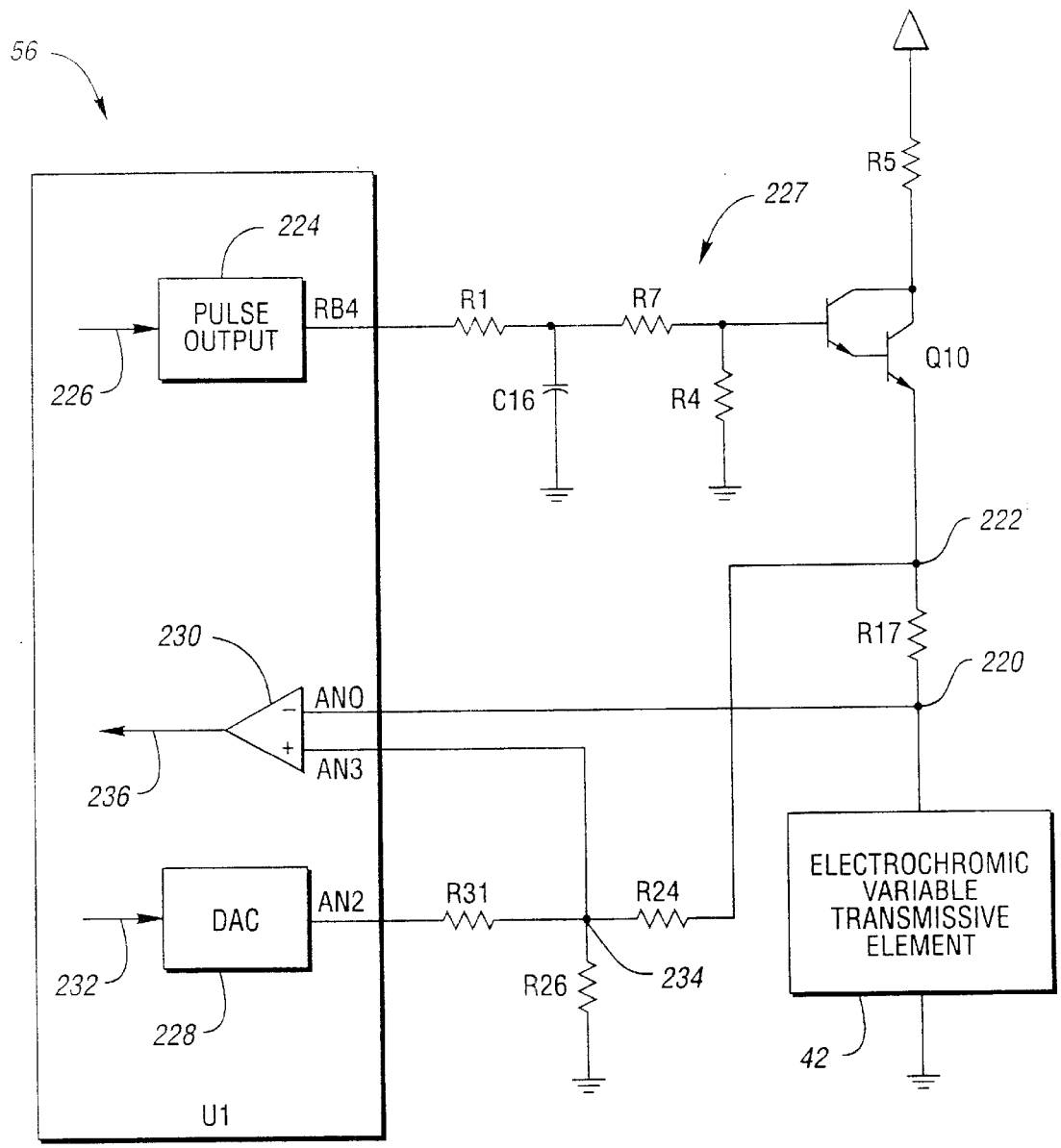
FIG. 8 is a schematic diagram illustrating operation of electrochromic element transmittance control.

Referring now to FIG. 8, a schematic diagram illustrating operation of electrochromic dimmer control is shown. A portion of dimmer logic 56 has been redrawn to more clearly illustrate control of electrochromic variable transmittance element 42. Electrochromic variable transmittance element 42 is preferably similar in operation to those described in U.S. Pat. No. 4,902,108 titled "SINGLE-COMPARTMENT, SELF-ERASING, SOLUTION-PHASE ELECTROCHROMIC DEVICES, SOLUTIONS FOR USE THEREIN, AND USES THEREOF" to Byker, which is incorporated herein by reference. Electrochromic variable transmittance element 42 darkens in response to a control voltage applied at input node 220. If the applied control voltage is removed, electrochromic variable transmittance element 42 will self discharge, transmitting an increasing amount of light. Electrochromic variable transmittance element 42 may be rapidly cleared by shorting input node 220 to ground. While the application described pertains particularly to automotive rearview mirrors, it will be understood by one of ordinary skill in the art that all or part of dimmer logic 56 may be used in a wide variety of electrochromic mirror and window applications.

Resistor R17 connects input node 220 to the emitter of Darlington pair Q10 at node 222. The collector of Q10 is connected to a power supply through current limiting resistor R5, typically 27 Ω. The base of Darlington pair Q10 is connected to digital output RB4 of microcontroller U1 through resistors R1 and R7. The base of Q10 is also connected to ground through resistor R4 and through resistor R7 and capacitor C16. Digital output pin RB4 is driven by pulse output 224 in response to pulse control 226 generated by software running on microcontroller U1. Pulse output 224 may produce a pulse signal such as, for example, a pulse width modulated signal. Preferably, pulse output 224 functions as a switch, setting output pin RB4 to either a high voltage or a low voltage once during each transition period as described with regards to FIG. 9 below. Capacitor C16 and resistors R1, R4, and R7 form a low pass filter, shown generally by 227, to smooth the signal appearing on digital output RB4. This smoothing results in a substantially constant applied control voltage at input node 220 for a fixed desired control level. Additionally, the base-to-emitter diode drops in Q10 together with the voltage divider formed between resistor R4, and the sum of resistors R1 and R7 sets the operating voltage for electrochromic variable transmittance element 42. Typical values for components are 1 kΩ or R1 and R4, 100Ω for R7, and 100 μF for C16. With digital output RB4 at 5 volts and nominal current draw by electrochromic variable transmittance element 42, input node 220 is approximately 1.2 volts.

The performance of dimming logic 56 can be improved through feedback of electrochromic variable transmittance element 42 applied control voltage at input node 220. Microcontroller U1 includes comparison logic to cause pulse output 224 to deliver a low voltage if the applied control voltage is greater than the desired control level and to deliver a high voltage otherwise. Typically, the high voltage is near $V_{DD}$ and the low voltage is near ground. This comparison may be made by comparing a digital number representing the desired control level with the digitized applied control voltage obtained using an analog-to-digital converter. Alternately, digital-to-analog converter (DAC) 228 and comparator 230 are used. DAC 228 produces a desired voltage level on analog output AN2 in response to the desired control level on DAC control 232 supplied by software running on microcontroller U1. Resistor R31 is connected between analog output AN2 and node 234 and resistor R26 is connected between node 234 and ground. One input of comparator 230, at analog input AN3, is connected to node 234. The other input of comparator 230, at analog input AN0, is connected to input node 220. The output of comparator 230 indicates if the desired voltage level is greater than the applied control voltage. Values for resistors R31 and R26 are chosen so that the voltage at node 234 is within the range of expected applied control voltages at input node 220 throughout the range of desired control voltages output from DAC 228. Typical values for R31 and R26 are 390 kΩ and 200 kΩ, respectively.

Positive feedback is achieved by connecting resistor R24 between node 234 and node 222. Resistor R17 is used to sense the drive current through electrochromic variable transmittance element 42 and, hence, is typically a low value such as 10 Ω. Resistor R24 is typically a high value such as 1.3 MΩ. As the drive current through resistor R17 increases, the voltage across resistor R17 increases pulling up the voltage at node 234. This increase in the voltage on the positive input terminal of comparator 230 has the regenerative effect of increasing the duty cycle from pulse output 224. This regenerative effect provides better system response at higher temperatures when electrochromic variable transmittance element 42 has an increased current draw together with an increase in maximum operating voltage. Positive feedback also offsets the effects of internal resistances within electrochromic variable transmittance element 42.

Figure 9:
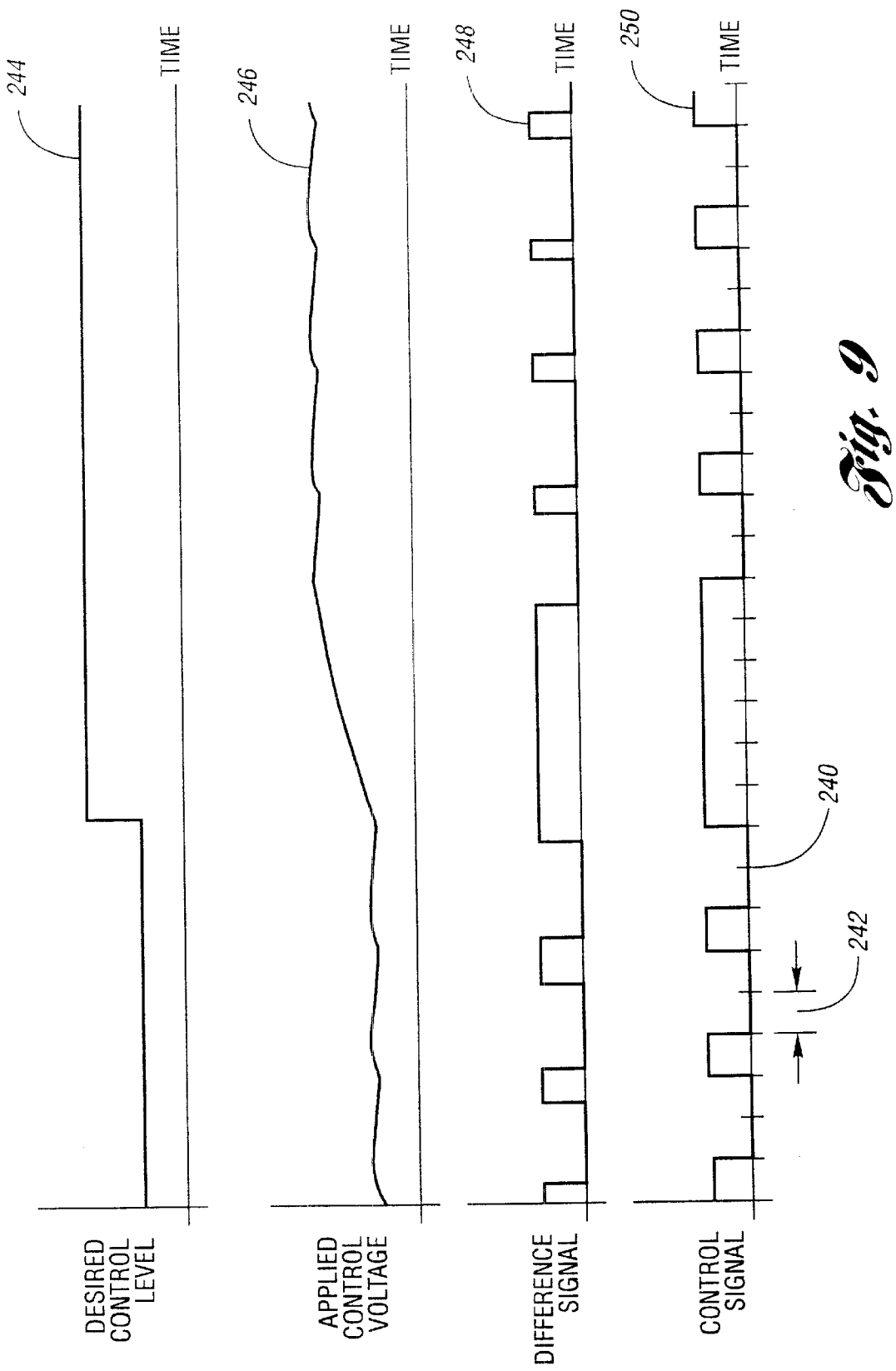
FIG. 9 is a timing diagram illustrating electrochromic element transmittance control.

Referring now to FIG. 9, a timing diagram illustrating electrochromic element transmittance control is shown. During automatic dimming operation, software executing in microcontroller U1 is initiated at transition points, one of which is indicated by 240, separated by fixed transition period 242. Desired control level 244 indicates the desired level of transmittance for electrochromic variable transmittance element 42. Desired control level 244 may be an analog value or, preferably, is a digital number determined by microcontroller U1. Desired control level 244 is compared to applied control voltage 246 by comparison logic. Comparator 230 accepts applied control voltage 246 and the desired control voltage appearing at node 234. Comparator output 236 produces difference signal 248 which is asserted when the desired voltage level representing desired control level 244 is greater than applied control voltage 246. Comparator output 236 is used to generate control signal 250 on output RB4. If desired control level 244 is greater than applied control voltage 246, digital output RB4 is switched high. If desired control level 244 is less than applied control voltage 246, digital output RB4 is switched low. Preferably, low pass filter 227 filters control signal 250 to produce applied control voltage 246.

The duration of transition period 242 is set to inhibit flicker in electrochromic element 42 that may be noticed, for example, by vehicle operator 22. Transition period 242 may preferably be between two seconds and two microseconds. For the system described with regards to FIGS. 7 and 8 above, five milliseconds may be used for transition period 242.

Figure 10:
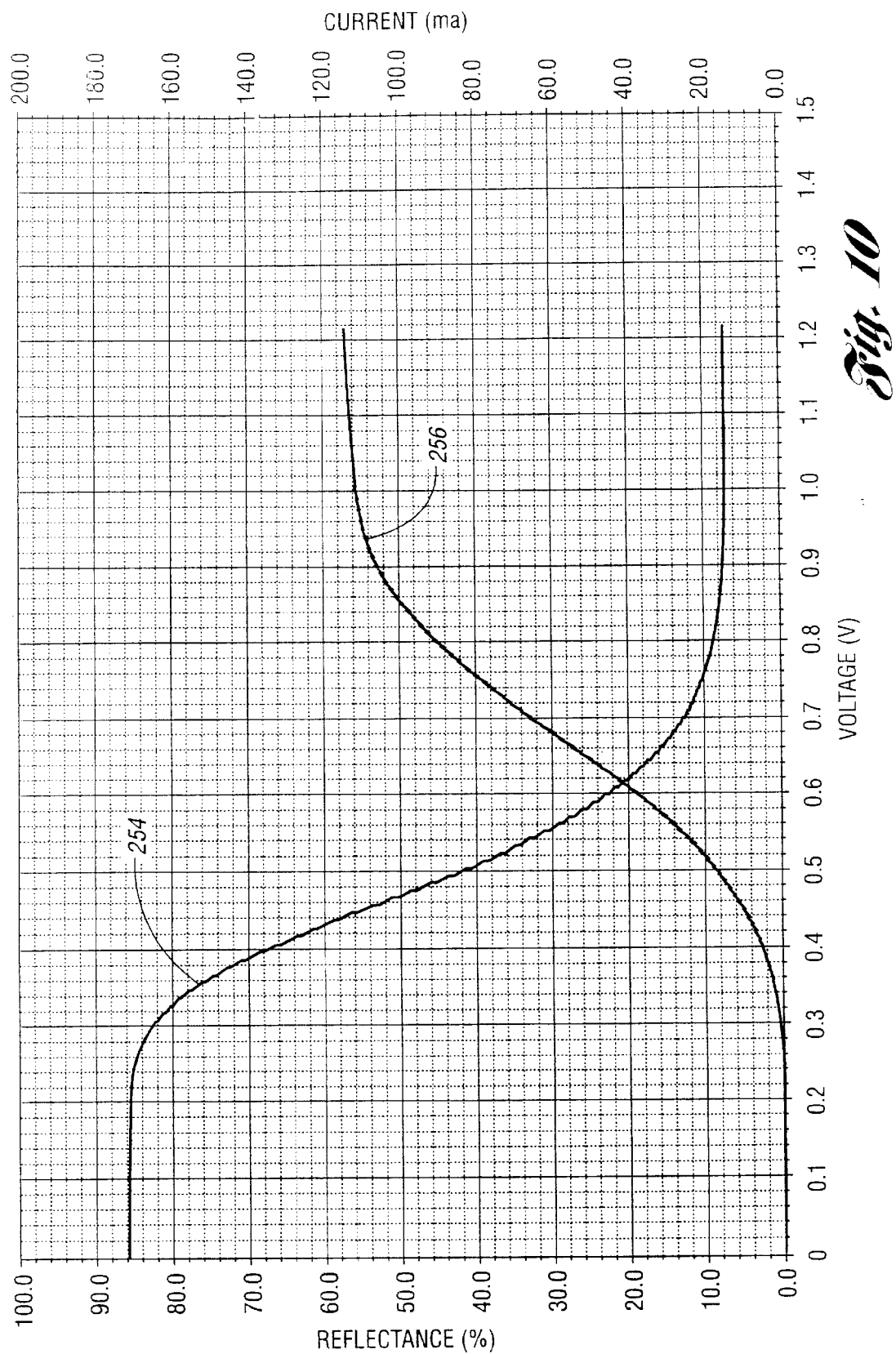
FIG. 10 is a graph indicating dimmer reflectance as a function of dimmer control signal duty cycle.

Referring now to FIG. 10, a graph indicating dimmer reflectance as a function of applied control voltage is shown. Curve 254 plots reflection as a percentage for dimming element 40 containing electrochromic variable transmittance element 42 as a function of applied control voltage 256. Curve 254 indicates a decrease in reflection from about 86% to about 8% as the applied control voltage is increased from about 0.2 V to about 0.9 V. FIG. 10 also includes curve 256 illustrating current draw as a function of applied control voltage 256 for typical electrochromic variable transmittance element 42.

Referring again to FIG. 7, additional circuitry is provided to rapidly clear variably transmissive electrochromic element 40. Transistor Q11 is connected across variably transmissive electrochromic element 40 with collector at node 220 and emitter at ground. The base of transistor Q11 is connected through resistor R23 to digital output RB7. When digital output RB7 is asserted, transistor Q11 turns on, acting as a switch to rapidly discharge electrochromic variable transmittance element 42. Capacitor C6 is connected between the collector and base of transistor Q11 to reduce electromagnetic interference created as transistor Q11 switches. Transistor Q12 is connected between the base of transistor Q10 and ground and is also controlled by digital output RB7. Transistor Q11 turns on with transistor Q12 to shut off transistor Q10 thereby preventing simultaneously attempting to darken and clear electrochromic variable transmittance element 42. Resistor R7 is placed between capacitor C16 and the collector of transistor Q12 to limit the discharge current from capacitor C16 through transistor Q12.

Figure 11:
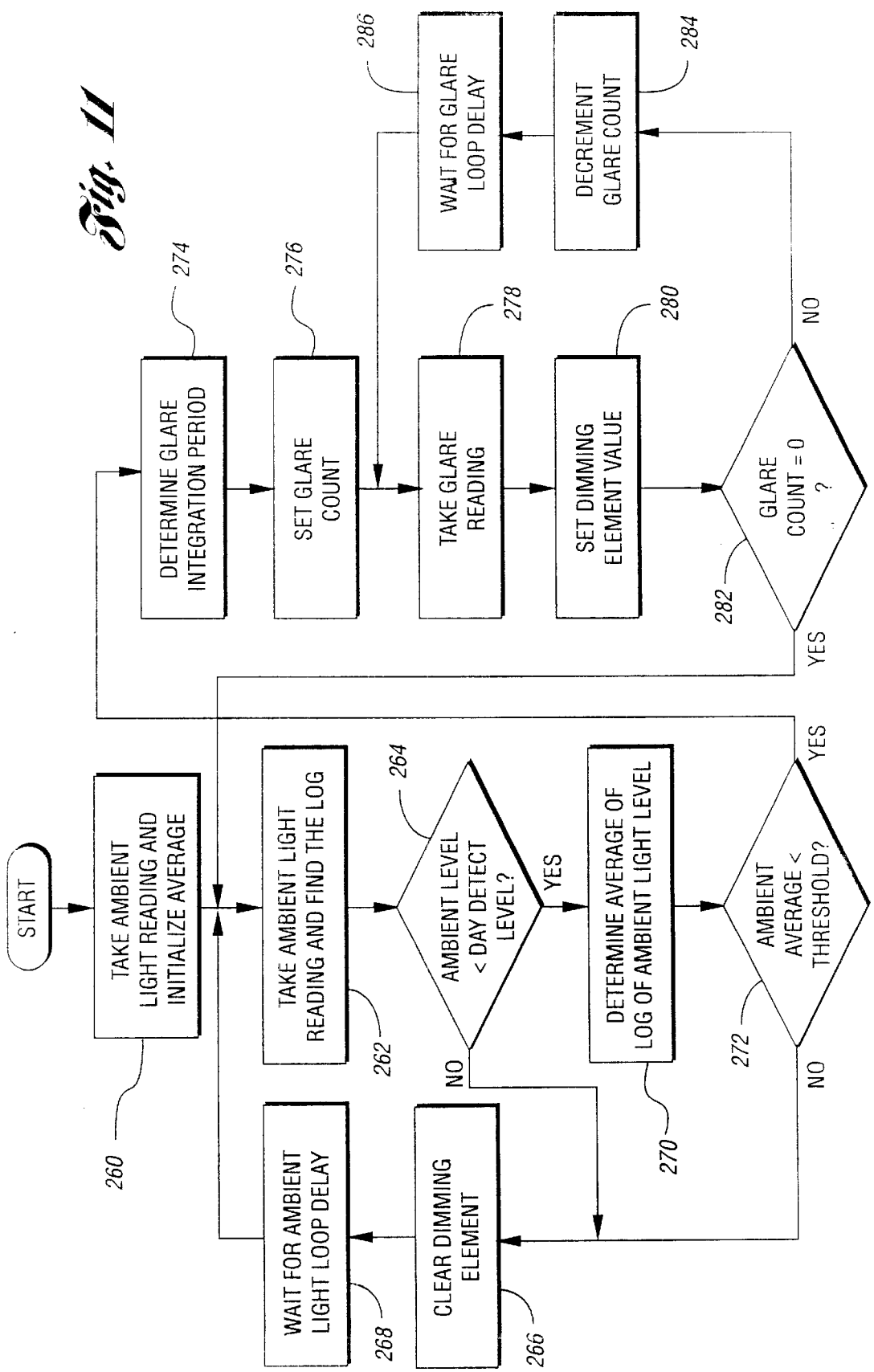
FIG. 11 is a flow diagram illustrating operation of dimming logic according to an embodiment of the present invention.

Referring now to FIG. 11, a flow diagram illustrating operation of dimming logic according to an embodiment of the present invention is shown. As will be appreciated by one of ordinary skill in the art, the operations illustrated are not necessarily sequential operations. Also, though the operations are preferably implemented by software executing in microcontroller U1, operations may be performed by software, hardware, or a combination of both. The present invention transcends any particular implementation and aspects are shown in sequential flow chart form for ease of illustration.

An ambient light reading is taken and the average ambient light is initialized in block 260. When the automatic dimming system is initially powered up, the average ambient light level is initialized by taking a first reading of ambient light 32 using ambient light sensor 48. Acquiring an ambient light reading and the average ambient light level are described with regard to blocks 262 and 270, respectively, below.

An ambient light reading is taken and the log of the ambient light reading is found in block 262. The use of semiconductor ambient light sensor 48 with integral charge collection produces ambient light signal 50 having good resolution over a wide range of ambient light levels 32. As described with regard to FIG. 3 above, this is accomplished by taking various readings of ambient light 32 using different integration periods 76, 82, 88. In a preferred embodiment, four separate integration periods are used such as, for example, 600 µs, 2.4 ms, 9.6 ms, and 38.4 ms. Each of these integration periods differs by a factor of four from adjacent periods. Therefore, for example, the 2.4 ms integration period causes ambient light sensor 48 to act four times more sensitive to ambient light 32 than does integrating with the 600 µs integration period. Typically, the shortest integration pulse 74 is first used by ambient light sensor 48 to produce short signal pulse 78. The width of short signal pulse 78 is measured by dimming logic 56. Since ambient light sensor 48 in complete darkness may still develop short signal pulse 78 having a width less than 100 µs, a minimum threshold is set for accepting short signal pulse 78 as accurately reflecting the level of ambient light 32. Typically, this threshold may be 300 µs. If short signal pulse 78 does not exceed the threshold, the next longest integration period is used by ambient light sensor 48. If the longest integration time does not yield a suitably long signal pulse, ambient light 32 is at an extremely low level and mirror 24, 26 can be operated at maximum sensitivity to glare 34.

Using the logarithm of ambient light signal 50 permits the use of an inexpensive microcontroller such as U1 which may have only 8-bit internal registers and no multiplication instructions. Since microcontrollers are binary devices, base two logarithms require fewer instructions to compute than base ten logarithms or natural logarithms. An algorithm is now described for obtaining an 8-bit, binary logarithm having the most significant four bits representing an integer part and the least significant four bits a fractional part. The 8-bit ambient light signal 50 resulting from the proper integration period is examined bit-by-bit starting with the most significant bit until the first binary one is found. The bit position containing the first binary one becomes the integer portion of the logarithm. The four most significant bits following the bit position containing the first binary one become the fractional portion of the logarithm. This value is incremented by one-sixteenth to better approximate the logarithm. An example of the binary logarithm approximation is now provided. Suppose ambient light signal 50 is determined to be 44 (00101101 in base two), the most significant asserted bit is bit five, so the integer portion of the resultant value is binary 0101. The next four bits following bit five are 0110 so the fractional part of the resultant value is 0110 for a total value of 0101.0110. After incrementing, the binary logarithm approximation becomes 0101.0111.

Figure 12:
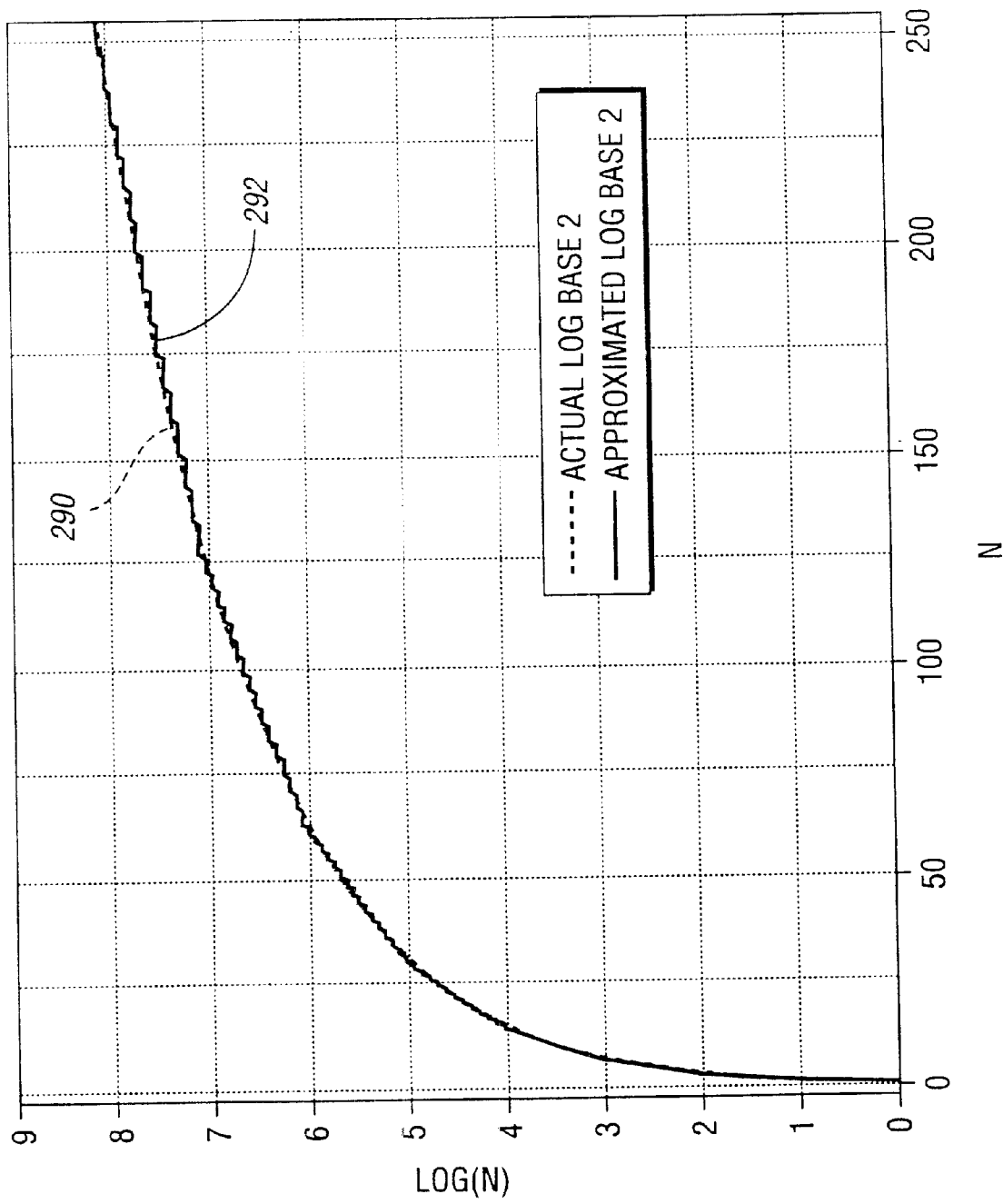
FIG. 12 is a graph illustrating binary logarithmic approximation implemented in an embodiment of the dimming logic.

Referring now to FIG. 12, a graph illustrating binary log approximation according to the above algorithm is shown. The binary logarithm is plotted for values of N between 1 and 255. Curve 290 shows the actual binary logarithm. Curve 292 shows the approximated binary logarithm.

Ambient light signal 50 must be scaled to compensate for different possible integration periods. This may be accomplished by adding a scaling factor to the binary logarithm of ambient light signal 50. For example, if the longest integration time (38.4 ms) is used to measure ambient light 32, a scale factor of 0 is added. If the next longest integration time (9.6 ms) is used, a scale of factor of 2 is added. If the next longest integration time (2.4 ms) is used, 4 is added. If the shortest integration time (600 $\mu$s) is used, 6 is added. Since the largest value resulting from the binary logarithm approximation is 8 (1000.0000), no overflow results from adding the scale factor.

Referring again to FIG. 11, the logarithm of the ambient light level is compared to the day detect level in block 264. The day detect level is used to prevent dimming of, or to more rapidly clear, dimming element 40 during rapid transitions from dark to bright such as if vehicle 20 emerges from a tunnel into daylight. If the logarithm of ambient light 32 exceeds a preset day detect level, variable transmittance element 42 is cleared to set dimming element 40 to maximum reflectance in block 266. Processing is then delayed in block 268. A wait loop is entered having a time sufficiently long to make the period between taking ambient light readings equal a constant ambient light loop delay. This period may be, for example, 400 ms. Following the wait in block 268, another reading of ambient light 32 is taken in block 262. If the logarithm of ambient light 32 does not exceed the day detect level, an average is obtained in block 270.

The average of the logarithm of ambient light level is determined in block 270. Averaging readings first converted to the logarithm of ambient light 32 reduces the effect of a temporary bright light in front of vehicle 20 from dramatically skewing the average reading of an otherwise dark ambient light 32. A running average of the log of ambient light signals 50 may be obtained from a digital low pass filter such as is described by Equation 1:

$$y(n) = \frac{1}{64}x(n) + \frac{63}{64}y(n-1) \qquad (1)$$

where x(n) is the most recently obtained binary log approximation of ambient light signal 50 correctly scaled for the integration period, y(n−1) is the previous filter output, and y(n) is the current filter output. The use of averaged logarithms with analog light signals is described in U.S. Pat. No. 5,204,778 entitled "CONTROL SYSTEM FOR AUTOMOTIVE REARVIEW MIRRORS" to Jon H. Bechtel, which is incorporated herein by reference.

The average of the log of the ambient light level is compared to a threshold in block 272. If ambient light 32 is sufficiently bright, vehicle operator 22 will not be dazzled by any reasonable amount of glare 34 allowing mirror 24, 26 to be set to maximum reflectance. Therefore, if the average of the log of ambient light signal 50 is not less than the threshold, dimming element 40 is cleared in block 266 and the wait of block 268 is executed. If the average of the log of ambient light signals 50 is less than the threshold, glare processing occurs beginning in block 274. Typically, the threshold used for comparison in block 272 is less than the day detect level used in the comparison of block 264.

The glare integration period is determined in block 274. The integration period for glare sensor 52 is determined based on ambient light signal 50. The glare integration period is inversely proportional to the binary antilogarithm of the average of the log of ambient light signal 50 as described by Equation 2:

$$T_G(n) = \text{anti log}_2(K_1 - y(n)) - K_2 \qquad (2)$$

where $T_G(n)$ is the integration period for glare sensor 52 for the filter output at sample time n, $K_1$ is a multiplicative constant, and $K_2$ is an additive constant. Constants $K_1$ and $K_2$ are determined experimentally. If the average of the log of ambient light signal 50 is below a certain level, a maximum glare sensitivity integration period is used.

A glare count is set in block 276. The glare count indicates the number of glare readings taken between ambient light readings. The product of the glare count and the glare loop delay should equal the time between taking ambient light readings. For example, the glare count may be three and the time between taking glare readings may be 133 ms.

A glare reading is taken in block 278. The pulse width returning from glare sensor 52 as glare signal 54 is measured for the glare integration period determined in block 274.

The dimming element value is set in block 280. Glare signal 54 is used to determine desired control level 244 setting the reflectance for dimming element 40. This may be accomplished, for example, through the use of a look-up table. The precise relationship between the level of glare 34 and the setting for variable transmittance element 42 depends upon factors including the construction of mirror 24, 26, the configuration of vehicle 20, and preferential settings by operator 22. Desired control level 244 may be used to control variable transmittance element 42 as described with regards to FIGS. 7–10 above.

A check of the glare count is made in block 282. If the glare count is zero, the next ambient light reading is taken in block 262. If the glare count is not zero, the glare count is decremented in block 284. A wait loop is then entered in block 286. The glare loop delay period is set so that glare readings are taken at regular, predetermined intervals.

Figure 13:
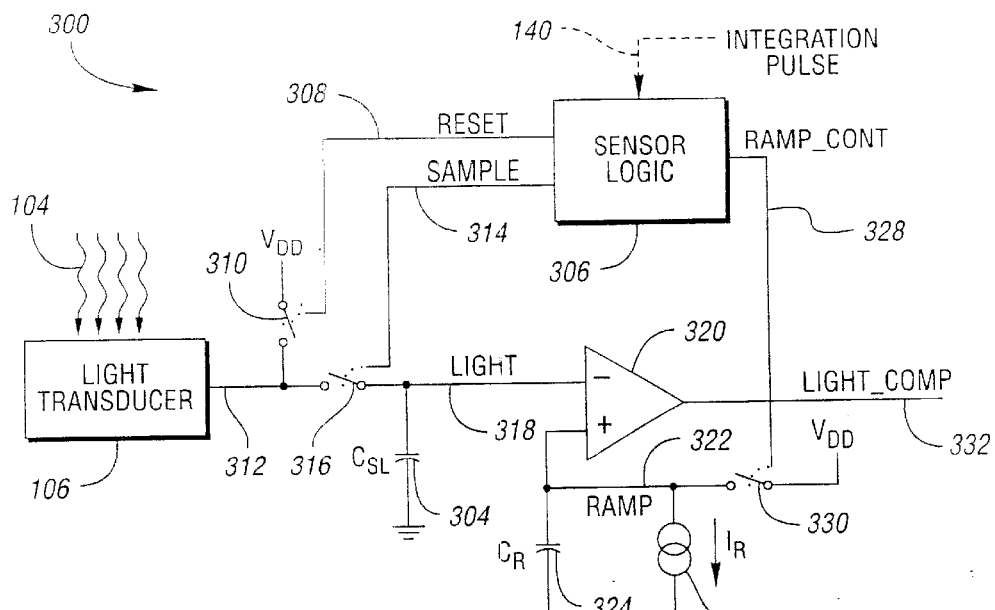
FIG. 13 is a schematic diagram illustrating operation of a light sensor having a pulse output according to an embodiment of the present invention.

Referring now to FIG. 13, a schematic diagram illustrating operation of a light sensor having a pulse output according to an embodiment of the present invention is shown. Light-to-pulse circuit 300 includes exposed light transducer 106 for converting light 104 incident on exposed light transducer 106 into charge accumulated in light storage capacitor 304, indicated by C$_{SL}$. Exposed light transducer 106 may be any device capable of converting light 104 into charge, such as the photogate sensor described in U.S. Pat. No. 5,471,515 entitled "ACTIVE PIXEL SENSOR WITH INTRA-PIXEL CHARGE TRANSFER" to E. a Fossum et al., which is incorporated herein by reference. Preferably, light transducer 106 is a photodiode such as is described with regards to FIGS. 25 and 26 below. Except as noted, the following discussion does not depend on a particular type of construction for exposed light transducer 106.

Light-to-pulse circuit 300 operates under the control of sensor logic 306. Sensor logic 306 generates reset signal 308 controlling switch 310 connected between exposed light transducer output 312 and $V_{DD}$. Sensor logic 306 also produces sample signal 314 controlling switch 316 between exposed light transducer output 312 and light storage capacitor 304. The voltage across light storage capacitor 304, light storage capacitor voltage 318, is fed into one input of comparator 320. The other input of comparator 320 is ramp voltage 322 across ramp capacitor 324. Ramp capacitor 324 is in parallel with current source 326 generating current $I_R$. Sensor logic 306 further produces ramp control signal 328 controlling switch 330 connected between ramp voltage 322 and $V_{DD}$. Comparator 320 produces comparator output 332 based on the relative levels of light storage capacitor voltage 318 and ramp voltage 322. Sensor logic 306 may generate reset signal 308, sample signal 314, and ramp control signal 330 based on internally generated timing or on externally generated integration pulse 140 as described with regard to FIGS. 18–21 below.

Figure 14:
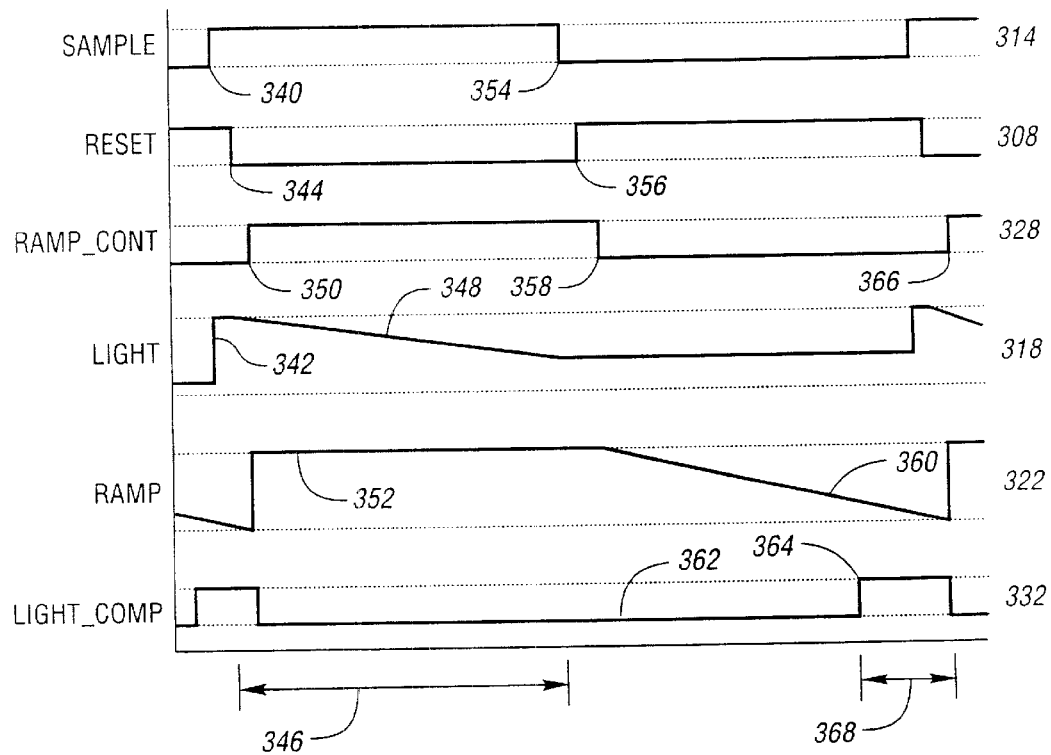
FIG. 14 is a timing diagram illustrating operation of the light sensor of FIG. 13.

Referring now to FIG. 14, a timing diagram illustrating operation of the light sensor of FIG. 13 is shown. A measurement cycle is started at time 340 when sample signal 314 is asserted while reset signal 308 is asserted. This closes switch 316 to charge light storage capacitor 304 to $V_{DD}$ as indicated by voltage level 342 in light storage capacitor voltage 318. Reset signal 308 is then deasserted at time 344, opening switch 310 and beginning integration period 346. During integration period 346, light 104 incident on exposed light transducer 106 generates negative charge causing declining voltage 348 in light storage capacitor voltage 318. At time 350, ramp control signal 328 is asserted closing switch 330 and charging ramp capacitor 324 so that ramp voltage 322 is $V_{DD}$ as indicated by voltage level 352.

Sample signal 314 is deasserted at time 354, causing switch 316 to open, thereby ending integration period 346. At some time 356 following time 354 and prior to the next measurement cycle, reset signal 308 must be asserted closing switch 310. At time 358, ramp control signal 328 is deasserted opening switch 330. This causes ramp capacitor 324 to discharge at a constant rate through current source 326 as indicated by declining voltage 360 in ramp voltage 322. Initially, as indicated by voltage level 362, comparator output 332 is unasserted because ramp voltage 322 is greater than light storage capacitor voltage 318. At time 364, declining voltage 360 in ramp voltage 322 drops below light storage capacitor voltage 318 causing comparator output 332 to become asserted. Comparator output 322 remains asserted until time 366 when ramp control signal 328 is asserted closing switch 330 and pulling ramp voltage 322 to $V_{DD}$. The difference between time 366 and time 364, indicated by pulse duration 368, is inversely related to the amount of light 104 received by exposed light transducer 106 during integration period 346.

Figure 15:
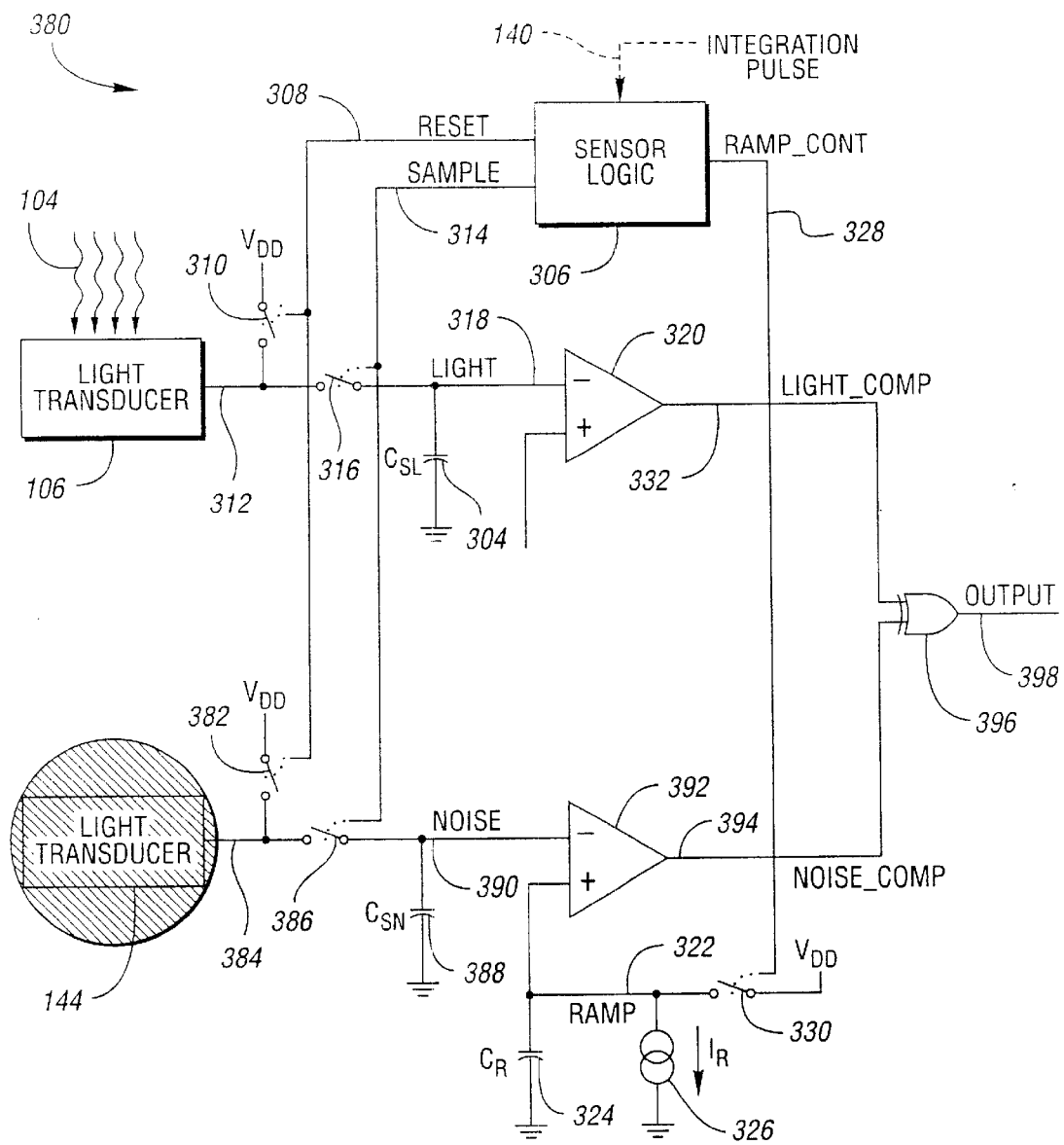
FIG. 15 is a schematic diagram illustrating operation of a light sensor with noise compensation according to an embodiment of the present invention.

Referring now to FIG. 15, a schematic diagram illustrating operation of a light sensor with noise compensation according to an embodiment of the present invention is shown. A light-to-pulse circuit, shown generally by 380, improves upon light-to-pulse circuit 300 by incorporating shielded light transducer 144 and associated electronics. Shielded light transducer 144 preferably has the same construction as exposed light transducer 106. However, shielded light transducer 144 does not receive light 104. Charge generated by shielded light transducer 144, therefore, is only a function of noise. This noise is predominately thermal in nature. If shielded light transducer 144 has the same construction as exposed light transducer 106, the noise signal produced by shielded light transducer 144 will closely approximate the same noise within the signal produced by exposed light transducer 106. By subtracting the signal produced by shielded light transducer 144 from the signal produced by exposed light transducer 106, the effect of noise in light transducer 106 can be greatly reduced.

Reset signal 308 controls switch 382 connected between shielded transducer output 384 and $V_{DD}$. Sample signal 314 controls switch 386 connected between shielded transducer output 384 and noise storage capacitor 388, indicated by $C_{SN}$. The voltage across noise storage capacitor 388, noise storage capacitor voltage 390, is one input to comparator 392. The second input to comparator 392 is ramp voltage 322. The output of comparator 392, noise comparator output 394, and comparator output 332 serve as inputs to exclusive-OR gate 396. Exclusive-OR gate 396 generates exclusive-OR output 398 indicating the intensity of light 104.

Figure 16:
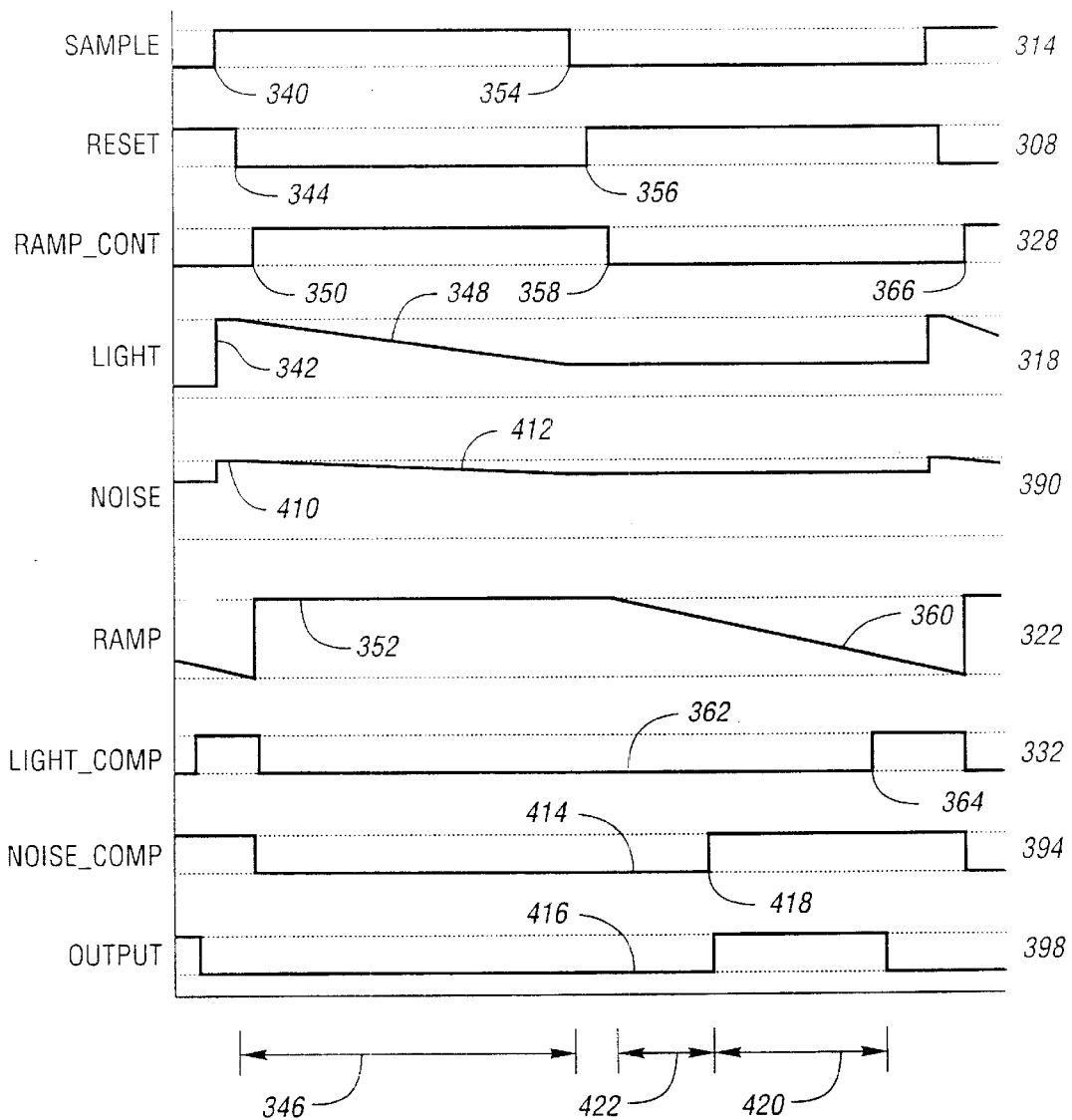
FIG. 16 is a timing diagram illustrating operation of the light sensor of FIG. 15.

Referring now to FIG. 16, a timing diagram illustrating operation of the light sensor of FIG. 15 is shown. Light-to-pulse circuit 380 functions in the same manner as light-to-pulse circuit 300 with regard to reset signal 308, sample signal 314, light storage capacitor voltage 318, ramp voltage 322, ramp control signal 328, and comparator output 332. At time 340, sample signal 314 is asserted while reset signal 308 is asserted. Switches 382 and 386 are both closed charging noise storage capacitor 388 to $V_{DD}$ as indicated by voltage level 410 in noise storage capacitor voltage 390. At time 344, reset signal 308 is deasserted opening switch 382 and causing declining voltage 412 in noise storage capacitor voltage 390 from charge produced by shielded light transducer 144 due to noise. At time 354, sample signal 314 is deasserted ending integration period 346 for noise collection. At time 358, ramp control signal 328 is deasserted causing declining voltage 360 in ramp voltage 322. Initially, as indicated by voltage level 414, noise comparator output 394 is unasserted because ramp voltage 322 is greater than noise storage capacitor voltage 390. Since comparator output 332 is also unasserted, output 398 from comparator 396 is unasserted as indicated by voltage level 416. At time 418, ramp voltage 322 drops below the level of noise storage capacitor voltage 390, causing noise comparator output 394 to become asserted. Since noise comparator output 394 and comparator output 332 are different, output 398 from comparator 396 is asserted. At time 364, ramp voltage 322 drops beneath the level of light storage capacitor voltage 318, causing comparator output 332 to become asserted. Since both noise comparator output 394 and comparator output 332 are now asserted, output 398 from exclusive-OR gate 396 now becomes unasserted. The difference between time 364 and time 418, output pulse duration 420, has a time period proportional to the intensity of light 104 incident on exposed light transducer 106 less noise produced by shielded light transducer 144 over integration period 346. The duration between time 418 and time 358, noise duration 422, is directly proportional to the amount of noise developed by shielded light transducer 144 over integration period 346. Since the majority of this noise is thermal noise, noise duration 422 is indicative of shielded light transducer 144 temperature. At time 366, ramp control signal 328 is asserted, deasserting both noise comparator output 394 and comparator output 332.

Figure 17:
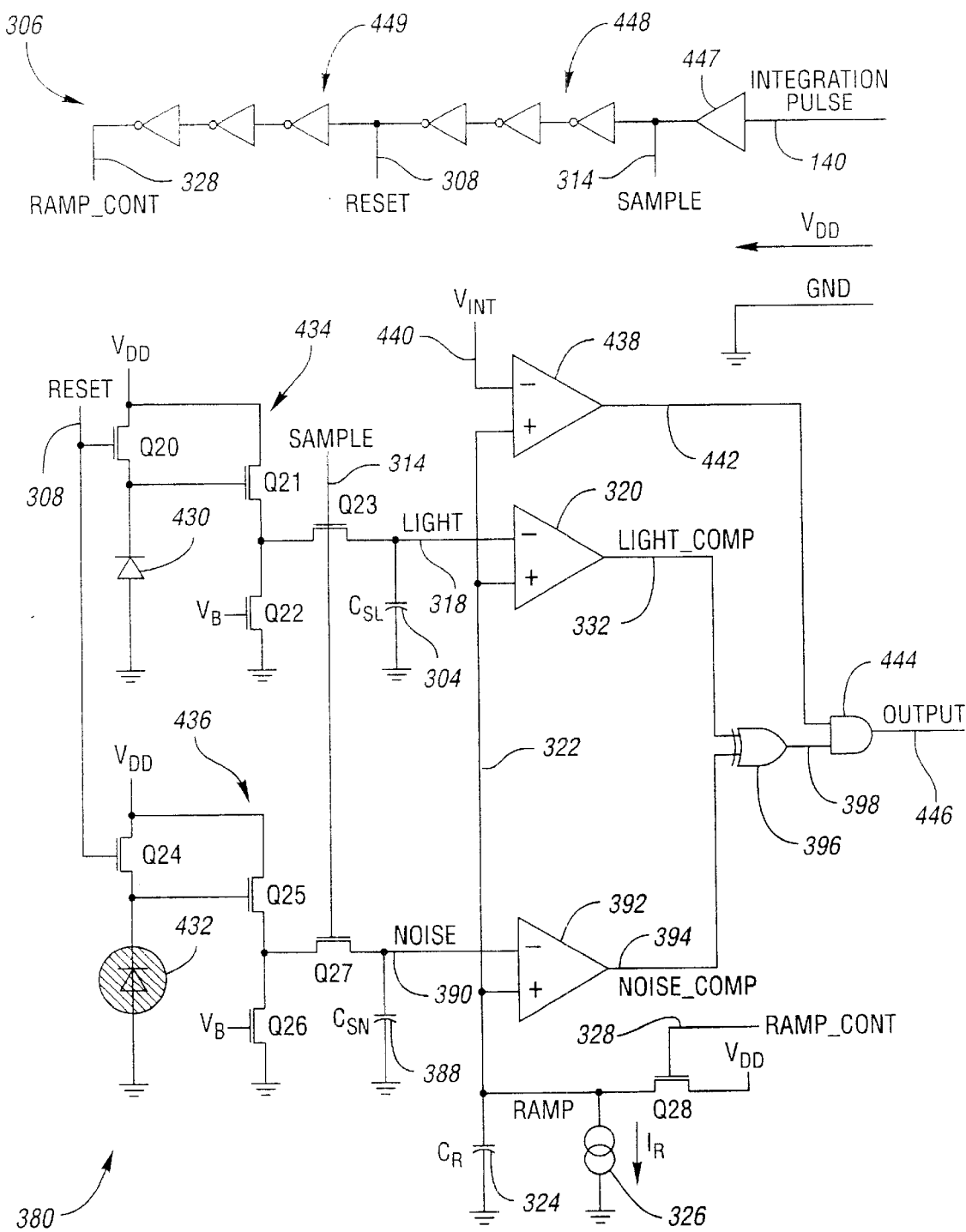
FIG. 17 is a schematic diagram of an implementation of the light sensor of FIG. 15 using photodiodes as light transducers.

Referring now to FIG. 17, a schematic diagram of an implementation of the light sensor of FIG. 15 using photodiodes as light transducers is shown. Light-to-pulse circuit 380 is implemented using exposed photodiode 430 for exposed light transducer 106 and shielded photodiode 432 for shielded light transducer 144. The anode of exposed photodiode 430 is connected to ground and the cathode connected through transistor Q20 to $V_{DD}$. The base of transistor Q20 is controlled by reset signal 308. Hence, transistor Q20 functions as switch 310. Transistors Q21 and Q22 are connected in series between $V_{DD}$ and ground to form a buffer, shown generally by 434. The base of transistor Q21 is connected to the collector of exposed photodiode 430. The base of load transistor Q22 is connected to fixed voltage $V_B$. The output of buffer 434 is connected through transistor Q23 to light storage capacitor 304. The base of transistor Q23 is driven by sample signal 314, permitting transistor Q23 to function as switch 316. The anode of shielded photodiode 432 is connected to ground and the cathode is connected to $V_{DD}$ through transistor Q24. The base of transistor Q24 is driven by reset signal 308 permitting transistor Q24 to function as switch 382. Transistors Q25 and Q26 form a buffer, shown generally by 436, isolating the output from shielded photodiode 432 in the same manner that buffer 434 isolates exposed photodiode 430. Transistor Q27 connects the output of buffer 436 to noise storage capacitor 388. The base of transistor Q27 is driven by sample signal 314 permitting transistor Q27 to function as switch 386. Typically, light storage capacitor 304 and noise storage capacitor 388 are 2 pF. Ramp capacitor 324, typically 10 pF, is charged to $V_{DD}$ through transistor Q28. The base of transistor Q28 is driven by ramp control signal 328 permitting transistor Q28 to function as switch 330. Ramp capacitor 324 is discharged through current source 326 at an approximately constant current $I_R$ of 0.1 µA when transistor Q28 is off.

Sensor power-up response is improved and the effective dynamic range extended by including circuitry to inhibit output if ramp voltage 322 drops beneath a preset voltage. Light-to-pulse circuit 380 includes comparator 438 comparing ramp voltage 322 with initialization voltage ($V_{INIT}$) 440. Comparator output 442 is ANDed with exclusive-OR output 396 by AND gate 444 to produce AND gate output 446. During operation, if ramp voltage 322 is less than initialization voltage 440, output 446 is deasserted. The use of comparator 438 and AND gate 444 guarantee that output 446 is not asserted regardless of the state of light-to-pulse circuit 380 following power-up. In a preferred embodiment, the initialization voltage is 0.45 V.

Sensor logic 306 generates control signals 308, 314, 328 based on integration pulse 140 which may be generated internally or provided from an external source. Buffer 447 receives integration pulse 140 and produces sample control 314. An odd number of sequentially connected inverters, shown generally as inverter train 448, accepts sample control 314 and produces reset control 308. A second set of odd-numbered, sequentially connected inverters, shown generally as inverter train 449, accepts reset signal 308 and produces ramp control signal 328. The circuit shown in FIG. 17 has a resolution of at least 8 bits and a sensitivity of approximately 1 volt per lux-second. The maximum output pulse duration 420 is independent of integration period 346 provided by the duration of integration pulse 140.

Figure 18:
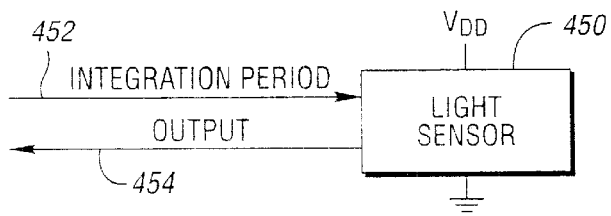
FIGS. 18–21 are block diagrams of various embodiments for light sensor packaging, output, and control.
Figure 19:
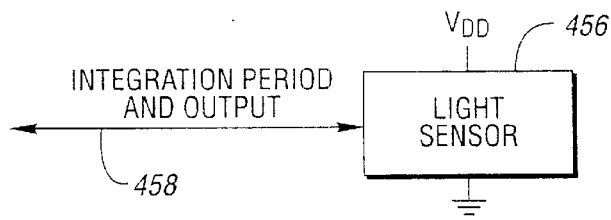
Figure 20:
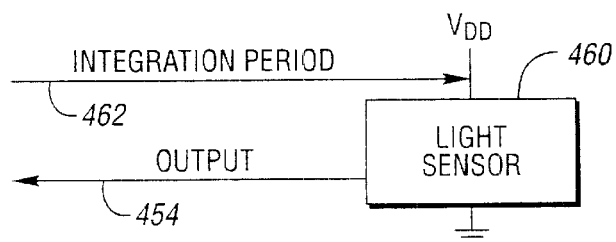
Figure 21:
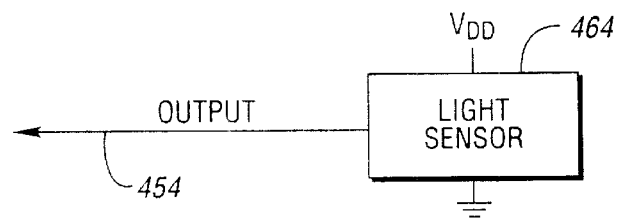

Referring now to FIGS. 18–21, various embodiments for light sensor packaging, output, and control are shown. Each embodiment may include light-to-pulse circuitry as described with regard to FIGS. 13–17 above. In FIG. 18, light sensor package 450 accepts four pins for supply voltage $V_{DD}$, ground, integration period signal 452, and output signal 454. Integration period signal 452 may be integration pulse 140 used by light-to-pulse circuit 380 to produce output 398 which is sent as output signal 454. In FIG. 19, light sensor package 456 requires only three pins for $V_{DD}$, ground, and combined integration period and output signal 458. Combined signal 458 may be interconnect signal 114 as described with regard to FIGS. 4 and 5 above. In FIG. 20, light sensor package 460 admits three pins for output signal 454, ground, and combined $V_{DD}$ and integration period signal 462. As is known in the art, combined signal 462 may be separated into power supply voltage $V_{DD}$ and integration period signal 452 through the use of filters. In FIG. 21, light sensor package 464 admits three pins for $V_{DD}$, ground, and output signal 454. Integration period signal 452 is generated within light sensor package 464 as described with regard to FIG. 22 below.

Figure 22:
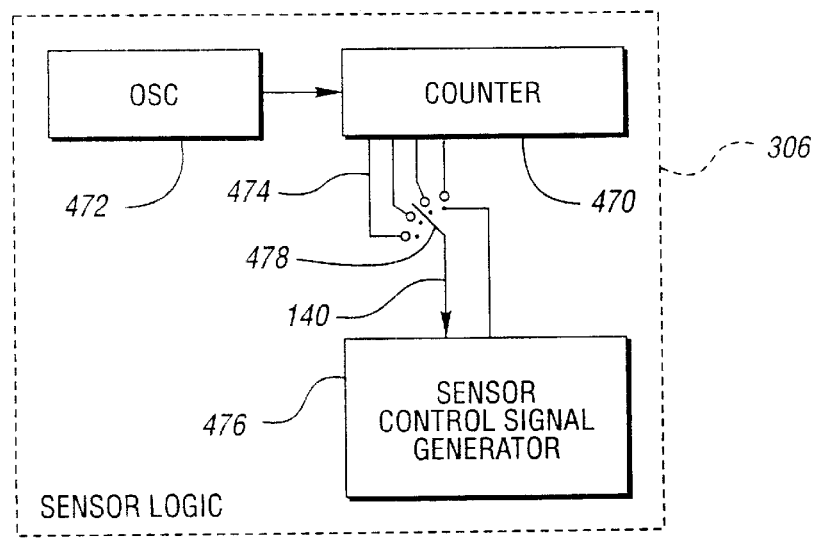
FIG. 22 is a block diagram of sensor logic for internally determining the integration period signal.

Referring now to FIG. 22, a block diagram of sensor logic for internally determining the integration period signal is shown. Sensor logic 306 may include free-running counter 470 driven by internal oscillator 472. Counter 470 may have taps, one of which is indicated by 474, connected to different counter bits. For example, one tap 474 may be connected to the $n^{th}+4$ bit, the next tap 474 to the $n^{th}+2$ bit, the next tap 474 connected to the $n^{th}+4$ bit, and so on, with each successive tap thereby providing a pulse with a period four times longer than the preceding tap 474. Sensor control signal generator 476 controls switch 478 to determine which tap 474 will be used to produce integration pulse 140. Typically, sensor control signal generator 476 sequences through each tap 474 repeatedly. Sensor control signal generator 476 then uses integration pulse 140 to generate control signals such as reset signal 308, sample signal 314, and ramp control signal 328 as described with regards to FIG. 17 above.

Figure 23:
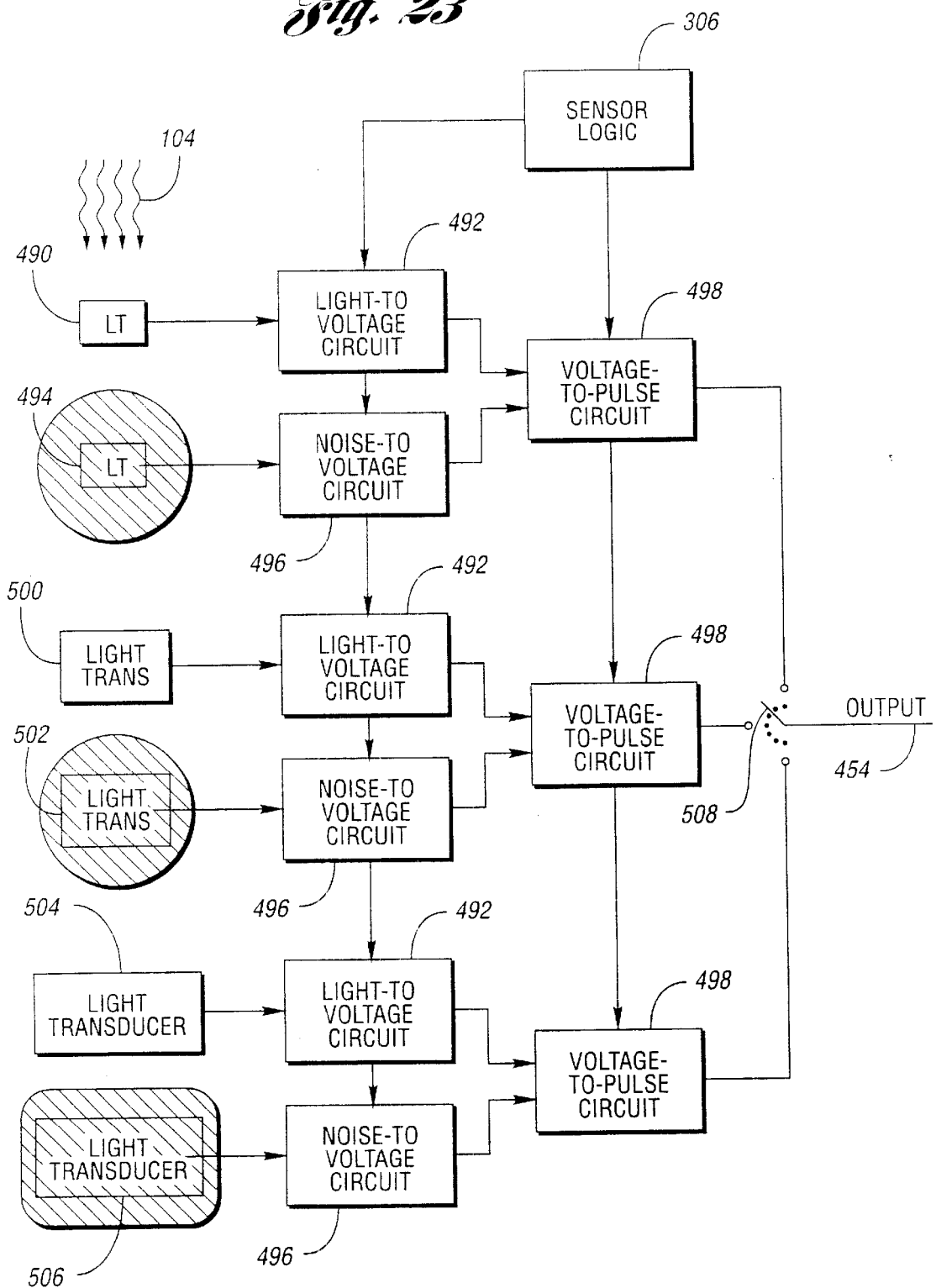
FIG. 23 is a block diagram illustrating the use of light transducers having different effective areas to achieve increased dynamic range according to an embodiment of the present invention.

Referring now to FIG. 23, a block diagram illustrating the use of light transducers having different effective areas to achieve increased dynamic range is shown. As an alternative to or together with varying the integration time, pairs of exposed light transducer 106 and shielded light transducer 144 having different effective areas may be used. If photodiodes 430, 432 are used as light transducers 106, 144, the effective area is the photodiode collector area. Small exposed light transducer 490 produces charge which is converted to a voltage by light-to-voltage circuit 492. Light-to-voltage circuit 492 may be implemented using switches 310, 316, and light storage capacitor 304 as described with regard to FIG. 15 above. Charge produced by small shielded light transducer 494 is converted to voltage by noise-to-voltage circuit 496. Noise-to-voltage circuit 496 may be implemented using switches 382, 386 and noise storage capacitor 388 as described with regard to FIG. 15 above. The outputs of light-to-voltage circuit 492 and noise-to-voltage circuit 496 are converted to a pulse with a width based on charge accumulated by small exposed light transducer 490 less charge due to noise integrated by small shielded light transducer 494 over an integration period by voltage-to-pulse circuit. Voltage-to-pulse circuit 498 may be implemented using comparators 320, 392, capacitor 324, current source 326, and gate 396 as described with regard to FIG. 15 above. Medium exposed light transducer 500 has an effective area larger than the effective area for small exposed light transducer 490, resulting in increased sensitivity. For example, if the effective area of medium exposed light transducer 500 is four times larger than the effective area of small exposed light transducer 490, medium exposed light transducer 500 will be four times more sensitive to light 104 than will be small exposed light transducer 490. Medium shielded light transducer 502 has an effective area the same as medium exposed light transducer 500. Additional light-to-voltage circuit 492, noise-to-voltage circuit 496, and voltage-to-pulse circuit 498 produce a noise-corrected output pulse with width based on light 104 incident on medium exposed light transducer 500. Similarly, large exposed light transducer 504 and large shielded light transducer 506 provide still increased sensitivity over medium exposed light transducer 500 and medium shielded light transducer 502 by having a still greater effective area.

Switch 508, under the control of sensor logic 306, sets which output from voltage-to-pulse circuits 498 will be used for output signal 454. Output signal 454 may be selected based on a signal generated within sensor logic 306 or may be based on a signal provided from outside of sensor logic 306.

In an alternative embodiment, only one shielded light transducer 144 is used. The output of shielded light transducer 144 is scaled prior to each noise-to-voltage circuit 496 in proportion to the varying effective areas of exposed light transducers 106. It will be recognized by one of ordinary skill in the art that, though the examples shown in FIG. 23 have three pair of exposed light transducer 106 and shielded light transducer 144, any number of pairs may be used.

Figure 24:
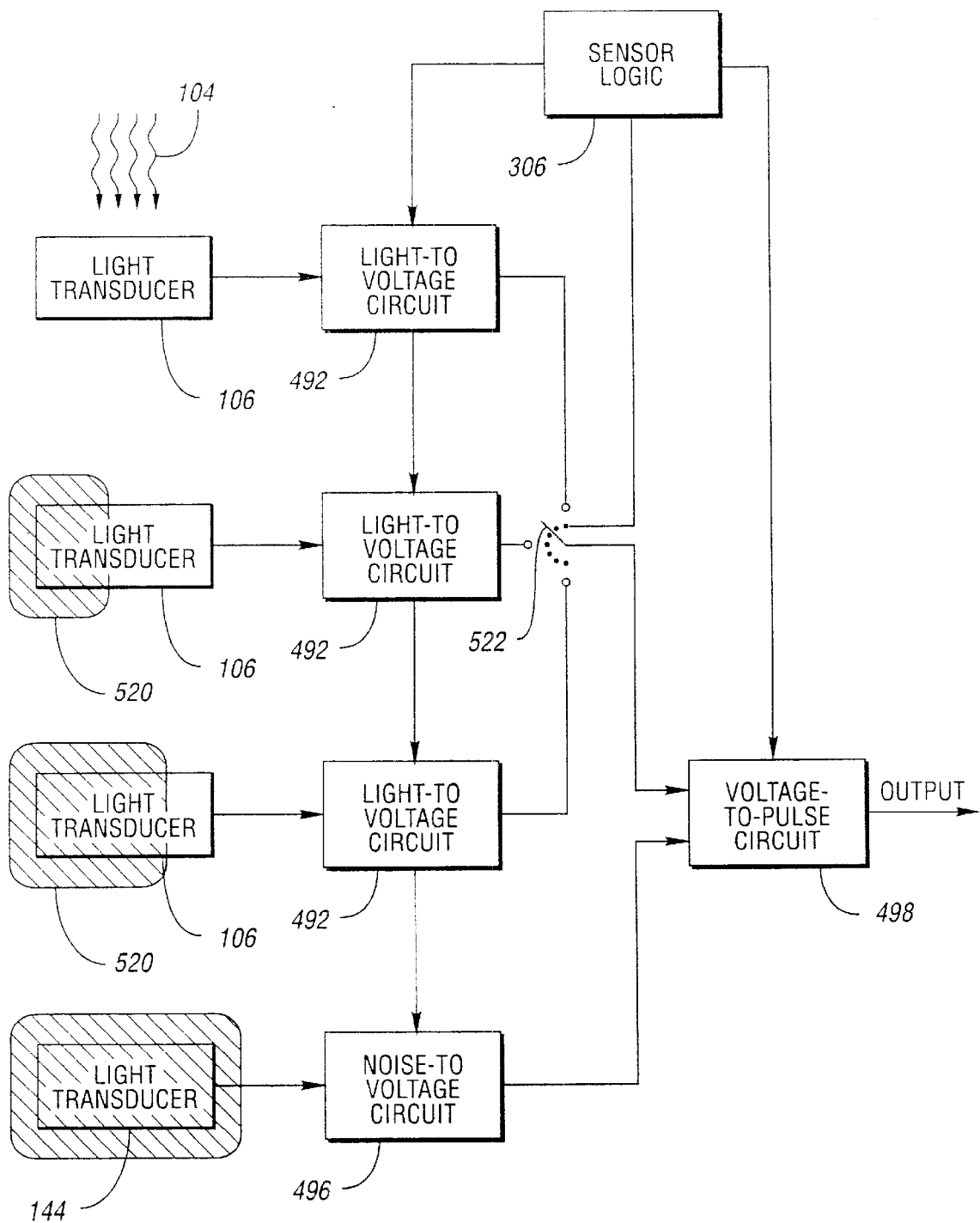
FIG. 24 is a block diagram illustrating the use of light transducers having different apertures to achieve increased dynamic range according to an embodiment of the present invention.

Referring now to FIG. 24, a block diagram illustrating the use of light transducers having different apertures to achieve increased dynamic range is shown. As an alternative to or together with specifying the integration period, exposed light transducers 106 having the same effective area may each have a different aperture admitting area for admitting light 104. Varying apertures may be produced using partial shield 520 blocking light 104 from reaching a portion of exposed light transducer 106. Each exposed light transducer 106 produces charge converted to a voltage by a corresponding light-to-voltage circuit 492. Switch 522 under the control of sensor logic 306 selects which output of light-to-voltage circuits 492 to forward to voltage-to-pulse circuit 498. Voltage-to-pulse circuit 498 produces output signal 454 compensated for noise sensed by shielded light transducer 144 and processed by noise-to-voltage circuit 496. Sensor logic 306 may select output of light-to-voltage circuits 492 based on an internally generated control signal or on a control signal received from outside of sensor logic 306.

Figure 25:
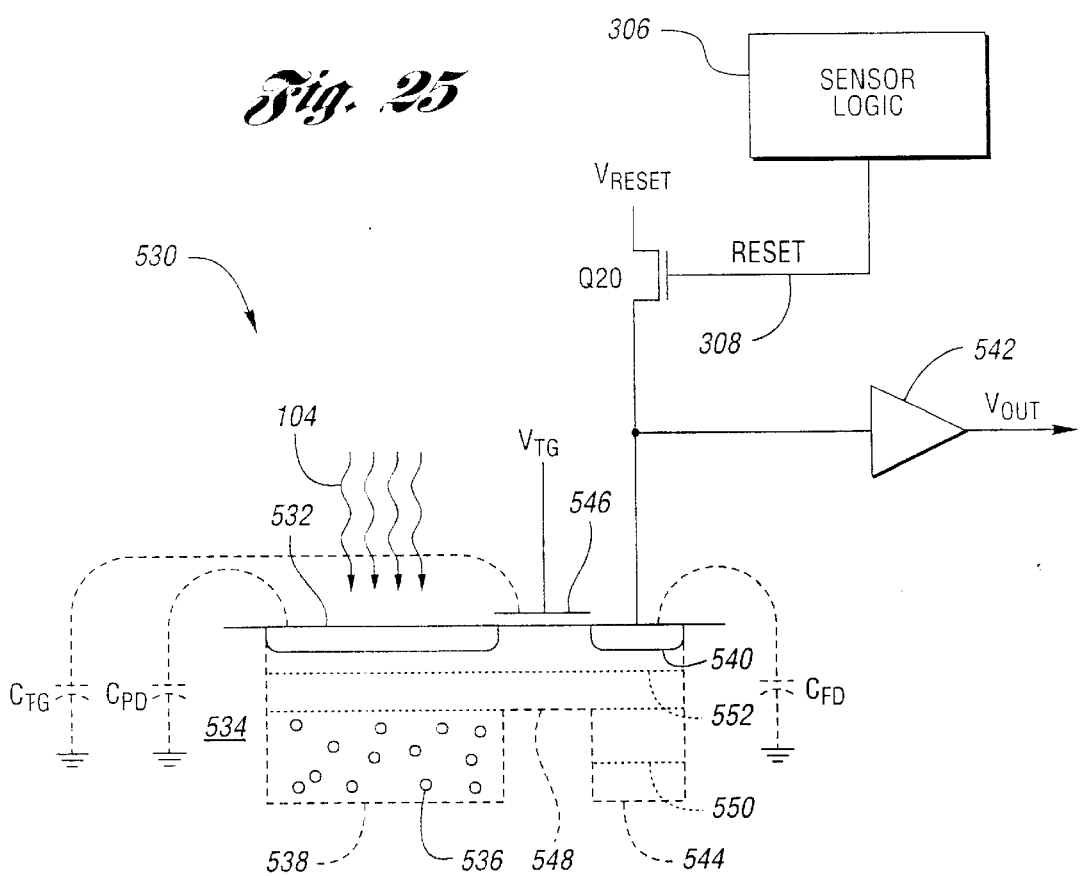
FIG. 25 is a schematic diagram illustrating different transducer capacitances for different amounts of light-induced charge to achieve increased dynamic range according to an embodiment of the present invention.

Referring now to FIG. 25, a schematic diagram illustrating different transducer capacitances for different amounts of light-induced charge to achieve increased dynamic range is shown. A photodiode, shown generally by 530, is formed by n-type diffusion 532 in p-type substrate 534. Light 104 incident on photodiode 530 generates charge 536 which may be accumulated in photodiode well 538 beneath n-type diffusion 532. Photodiode 530 has intrinsic photodiode capacitance $C_{PD}$. Floating diffusion 540 is also formed by diffusing n-type material in substrate 534. Floating diffusion 540 is connected through transistor Q20 to reset voltage $V_{RESET}$. The gate of transistor Q20 is connected to reset signal 308 under the control of sensor logic 306. Floating diffusion 540 is also connected to the input of buffer 542. The output of buffer 542 is transducer output $V_{OUT}$. Floating diffusion 540 defines diffusion well 544 formed in a region of substrate 534 when reset signal 308 is asserted. Floating diffusion 540 has an intrinsic floating diffusion capacitance $C_{FD}$. Transmission gate 546 is positioned between diffusion 532 and floating diffusion 540. Transmission gate 546 is held at voltage $V_{TG}$ to form transmission well 548 thereunder. Transmission well 548 has a depth shallower than photodiode well 538 and diffusion well 544. Transmission gate 546 has an intrinsic transmission gate capacitance $C_{TG}$.

When reset signal 308 is asserted, bringing floating diffusion 540 to $V_{RESET}$, charge is eliminated in diffusion well 544. Further, when charge is reset in diffusion well 544, any charge 536 in photodiode well 538 above the depth of transmission well 548 flows through transmission well 548, through floating diffusion 540, and is eliminated. During a light integration period, reset signal 308 is unasserted, causing the voltage of floating diffusion 540 to float based on the amount of charge 536 in diffusion well 544. As light 104 strikes diffusion 532, charge 536 is created. Since charge 536 in photodiode well 538 up to the level of transmission well 548 was not eliminated by charge reset, additional charge 536 produced by incident light 104 flows from photodiode well 538 through transmission well 548 and into diffusion well 544. At charge level 550, beneath the level of transmission well 548, only diffusion well 544 is filling with charge 536. Hence, the voltage of floating diffusion 540 is inversely proportional to floating gate capacitance $C_{FD}$. When enough charge 536 has been generated to fill diffusion well 544 above the level of transmission well 548 such as, for example level 552, diffusion well 544, transmission well 548, and photodiode well 538 all fill with charge 536. Hence, the voltage of floating diffusion 540 is now inversely proportional to the sum of floating diffusion capacitance $C_{FD}$, transmission gate capacitance $C_{TG}$, and photodiode capacitance $C_{PD}$.

Figure 26:
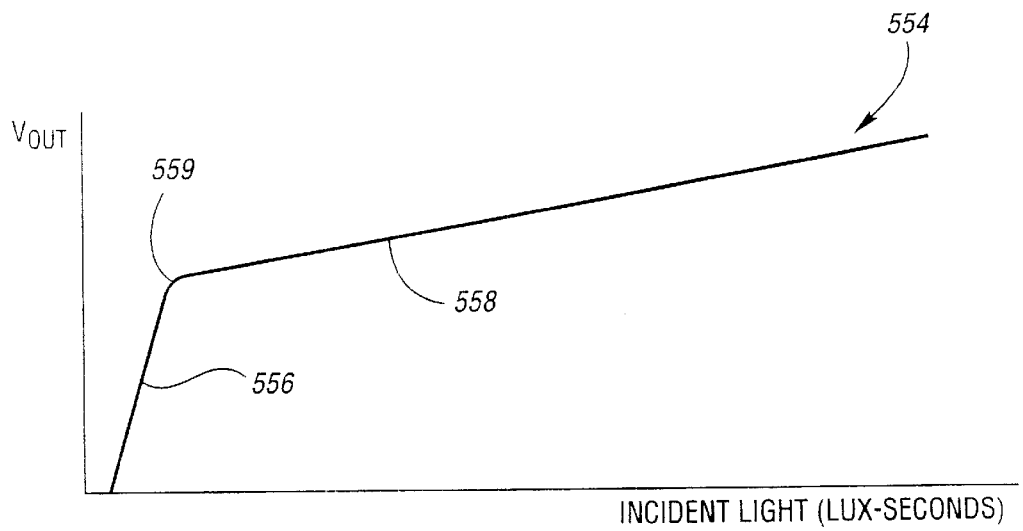
FIG. 26 is a graph of the output potential as a function of accumulated incident light for the transducer of FIG. 25.

Referring now to FIG. 26, a graph of output potential as a function of accumulated incident light for the transducer of FIG. 25 is shown. A curve, shown generally by 554, shows transducer output $V_{OUT}$ as a function of light 104 incident on diffusion 532 and, possibly, floating diffusion 540 over the integration period. During steep portion 556, charge 536 is accumulating in diffusion well 544 alone. Since the conversion gain is based only on floating diffusion capacitance $C_{FD}$, photodiode 530 appears to have a high sensitivity to incident light 104. During shallow portion 558, charge 536 is accumulated in diffusion well 544, transmission well 548, and photodiode well 538. Since the conversion gain is now dependent on the parallel combination of capacitances $C_{FD}$, $C_{TG}$, and $C_{PD}$, photodiode 530 now appears less sensitive to incident light 104. By adjusting voltages $V_{RESET}$ and $V_{TG}$, knee point 559 between steep portion 556 and shallow portion 558 can be shifted affecting the dynamic range. For example, if the maximum voltage swing for floating diffusion 540 is 1 volt; the ratio of $C_{FD}$ to the sum of $C_{FD}$, $C_{TG}$, and $C_{PD}$ is 1:100; and knee point 559 is set at 0.5 volts, the dynamic range of photodiode 530 is increased about 50 times over the dynamic range of a similar photodiode without dual capacitance.

Figure 27:
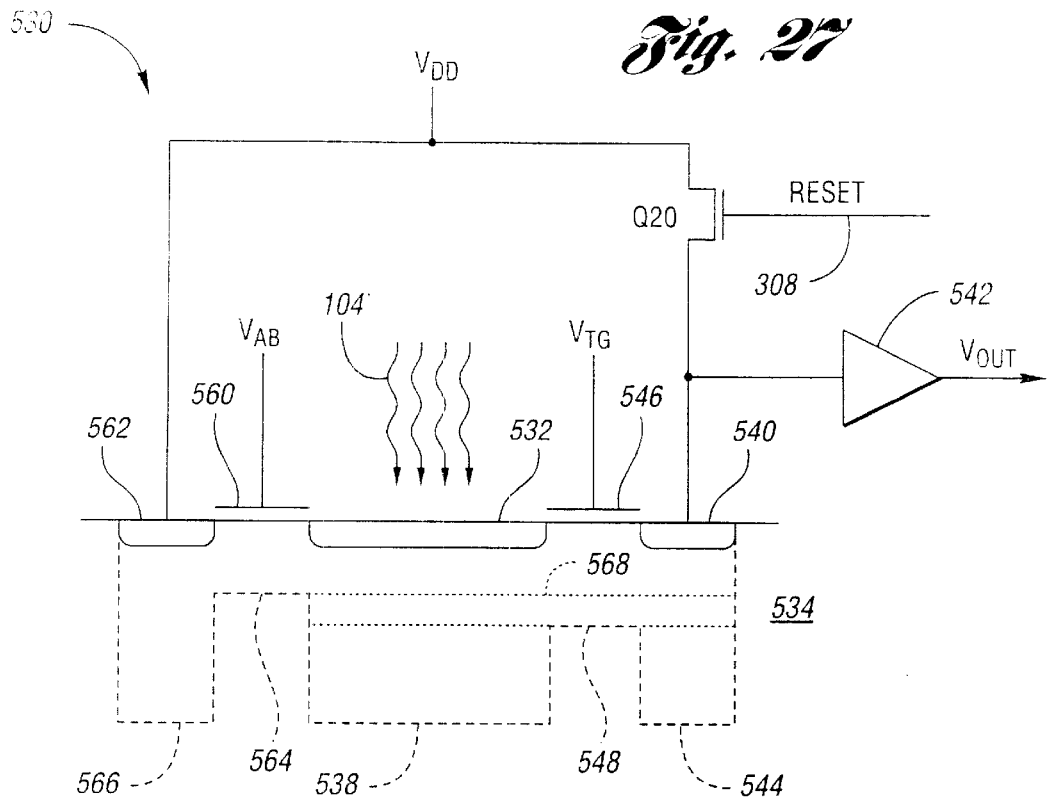
FIG. 27 is a schematic diagram illustrating a photodiode transducer incorporating an anti-bloom gate according to an embodiment of the present invention.

Referring now to FIG. 27, a schematic diagram illustrating a photodiode transducer incorporating an anti-bloom gate according to an embodiment of the present invention is shown. Anti-bloom gate 560 is formed between diffusion 532 and source voltage diffusion 562 tied to $V_{DD}$. Anti-bloom gate 560 is tied to anti-bloom voltage $V_{AB}$. Anti-bloom gate 560 forms anti-bloom well 564 in substrate 534 between photodiode well 538 and source diffusion well 566. Anti-bloom voltage $V_{AB}$ is less than transmission gate voltage $V_{TG}$ well 564, making anti-bloom well 564 shallower than transmission well 548. When accumulated charge generated by photodiode 530 exceeds charge level 568 equal to the depth of anti-bloom well 564, the excess charge flows beneath anti-bloom gate 560 into source voltage diffusion 562 and is eliminated. Anti-bloom gate 560 prevents output voltage $V_{OUT}$ from dropping below a level detectable by comparator 320 in light-to-pulse circuit 380.

Figure 28:
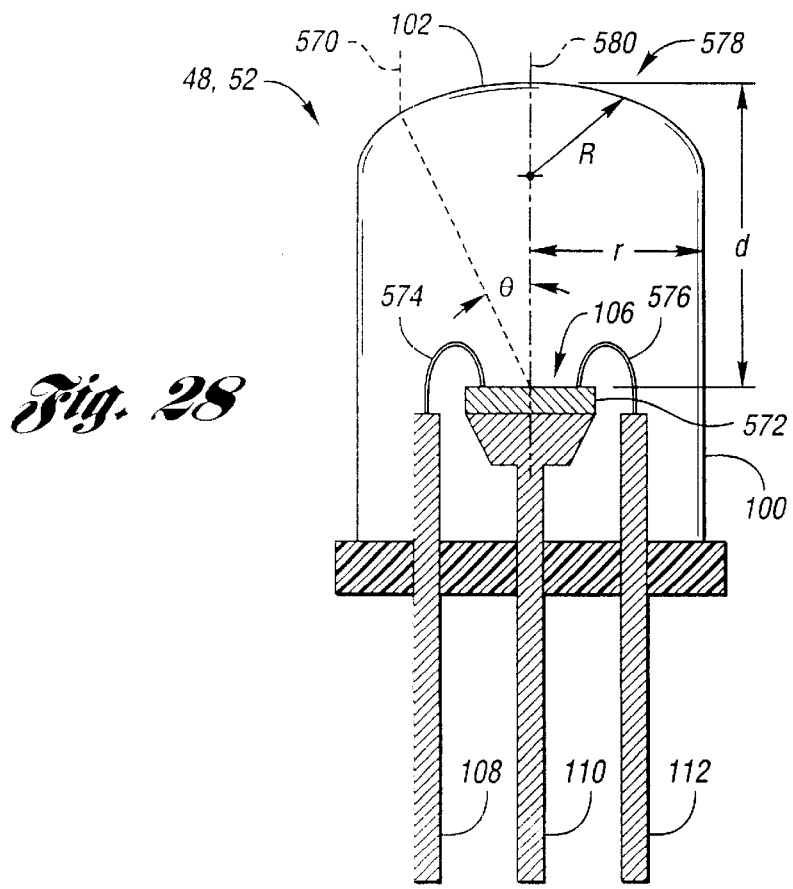
FIG. 28 is a drawing illustrating an enclosure for a light sensor according to an embodiment of the present invention.

Referring now to FIG. 28, a drawing illustrating enclosure for a light sensor according to an embodiment of the present invention is shown. Light sensor 48, 52 includes enclosure 100 having window 102 for admitting light, one ray of which is indicated by 570. Enclosure 100 admits power pin 108, ground pin 110, and signal pin 112. Semiconductor die 572, encapsulated within enclosure 100, incorporates light transducers 106,144 and associated electronics as described with regards to FIGS. 4–5 and 13–26 above. Pins 108, 110, 112 may be wire bonded to die 527, as shown by wire 574 for power pin 108 and wire 576 for signal pin 112, or may be directly bonded to die 527, as shown for ground pin 110.

Preferably, enclosure 100 is the same type used to construct three-terminal light emitting diodes (LEDs). A preferred format is commonly referred to as the T-1¼ or 5 mm package. Encapsulating electronics in such packages is well known in the art of optical electronics manufacturing.

A lens, shown generally by 578, is preferably used to focus light onto exposed light transducer 106. Lens 578 may be placed in front of light sensor 48, 52 or, preferably, may be incorporated into window 102 as shown in FIG. 28. Lens 578 defines the field of view of light sensor 48, 52 and provides improved sensitivity through optical gain.

Figure 29:
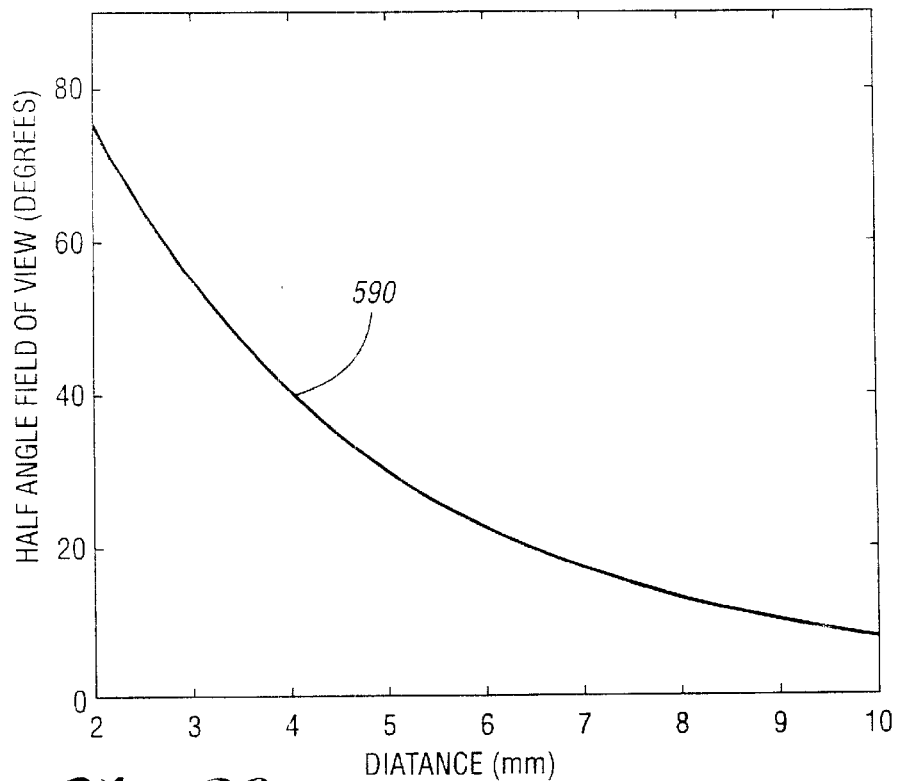
FIG. 29 is a graph illustrating light sensor field of view as a function of light transducer distance from the lens.

Referring now to FIG. 29, a graph illustrating light sensor field of view as a function of light transducer distance from the lens is shown. The field of view for exposed light transducer 106 in light sensor 48, 52 is defined as view angle θ made by marginal ray 570 with respect to optical axis 580 through exposed light transducer 106. The half angle field of view for spherical lens 578 is expressed by Equation 3:

$$\theta = 90 - \arccos\left(\frac{r}{R}\right) + \frac{n_2}{n_1} \cdot \sin\left(\arccos\left(\frac{r}{R}\right) - \arctan\left(\frac{d - (R - \sqrt{R^2 - r^2})}{r}\right)\right) \quad (3)$$

where r is the lens aperture radius, R is the radius of curvature of lens 578, n2 is the index of refraction of material within enclosure 100, $n_1$ is the index of refraction outside of enclosure 100, d is the distance from the center of lens 578 to exposed light transducer 106, and θ is measured in degrees. Typically, T-1¾ enclosure 100 is filled with epoxy and sensor 48, 52 operates in air making the ratio of $n_2$ to $n_1$ approximately 1.5. Curve 590 plots a half-angle field of view θ as a function of distance d for a T-1¾ enclosure having a spherical lens 578 with radius R of 5.0 mm. As light transducer 106 moves farther from lens 578, the field of view decreases.

Figure 30:
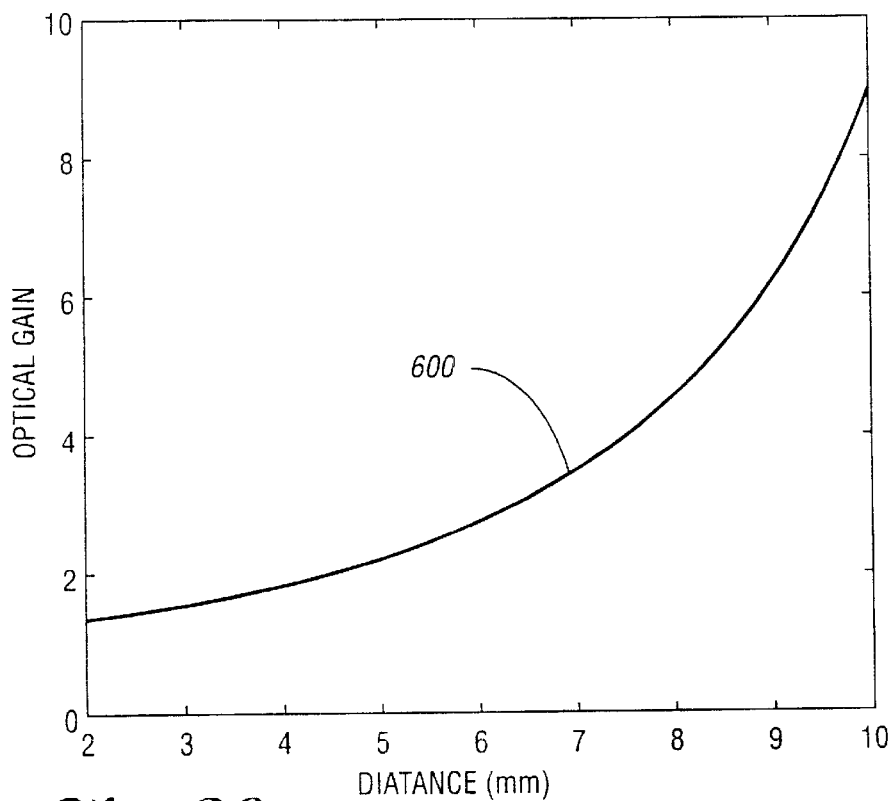
FIG. 30 is a graph illustrating light sensor optical gain as a function of light transducer distance from the lens.

Referring now to FIG. 30, a graph illustrating light sensor optical gain as a function of light transducer distance from the lens is shown. Assuming paraxial approximation for rays 570, the optical gain of lens 578 can be estimated by considering the ratio of additional optical energy collected by light transducer 106 with lens 578 to the optical energy collected by light transducer 106 without lens 578. This can be computed by considering a cone of light with a base at the surface of lens 578 and a point at the focal point f of lens 578. The optical gain G may then be expressed as a function of the ratio of the cross section of the cone to the area of light transducer 106 which reduces to Equation 4:

$$G = \frac{f^2}{(f-d)^2} \quad (4)$$

Curve 600 shows optical gain G as a function of distance d for a T-1¾ enclosure having a spherical lens 578 with radius R of 5.0 mm and a focal length of 15.0 mm. As light transducer 106 moves farther from lens 578, the optical gain increases.

The distance d between lens 578 and light transducer 106 can be adjusted for optimal performance of ambient light sensor 48 and glare sensor 52. Ambient light sensor 48 should have a wide field of view but need not be as sensitive as glare sensor 52. Glare sensor 52 should have a narrower field of view but must be more sensitive and, therefore, benefits from a higher optical gain. For the lens described with regards to FIGS. 29 and 30 above, a distance d of between 2 mm and 3 mm is suitable for ambient light sensor 48 and a distance d of between 6 mm and 7 mm is suitable for glare sensor 52. In addition to modifying lens parameters, other lens types such as a spheric, cylindrical, and the like are possible within the spirit and scope of the present invention.

Figure 31:
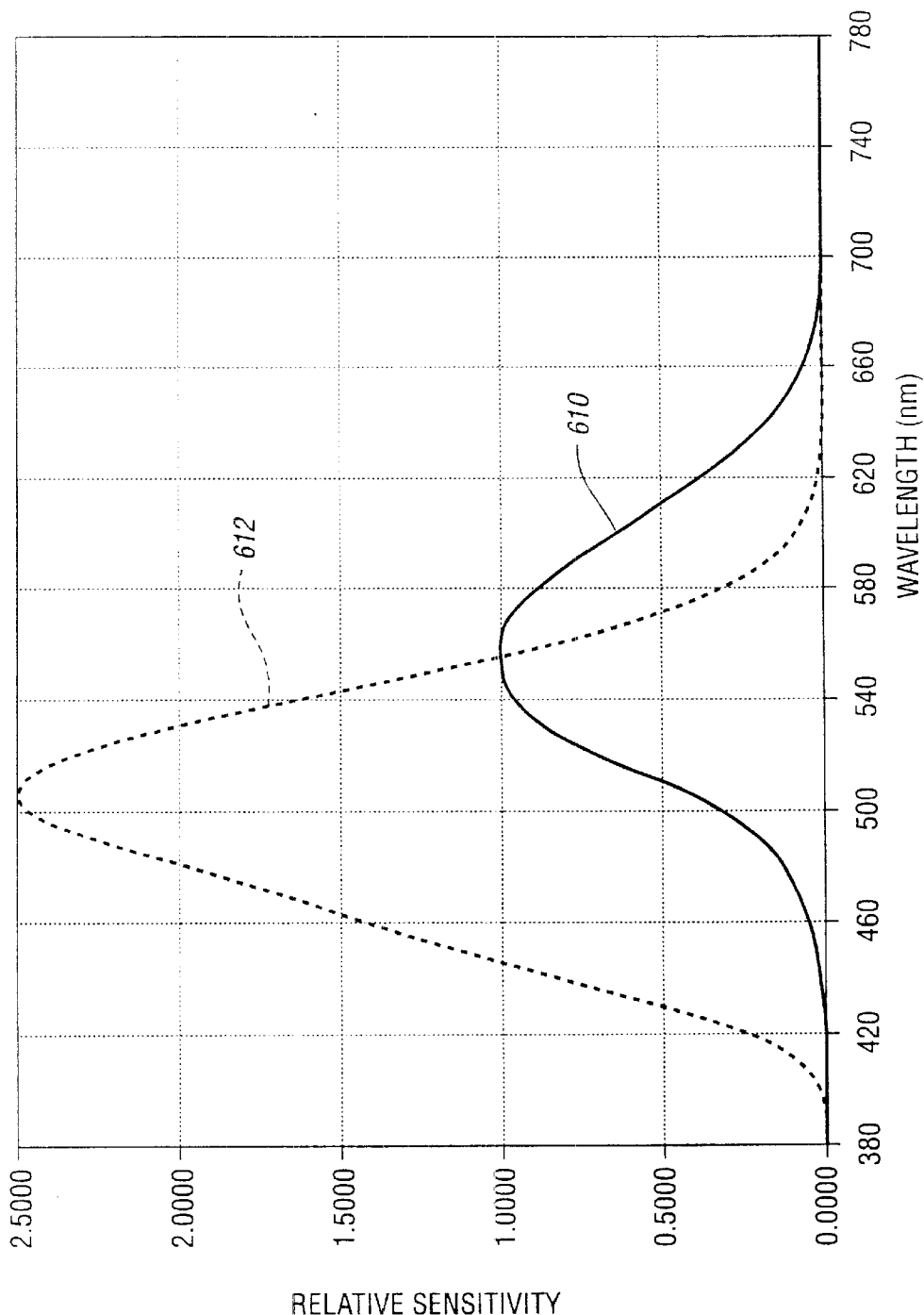
FIG. 31 is a graph illustrating frequency response of the human eye.

Referring now to FIG. 31, a graph illustrating frequency response of the human eye is shown. Curve 610 is the relative photopic or daylight frequency response of the human eye. Curve 612 is the relative scotopic or night frequency response of the human eye. In addition to being more sensitive to light intensity, scotopic response 612 is shifted more towards violet than photopic response 610. In order to preserve night vision, which degrades rapidly when exposed to bright light particularly in the range of scotopic curve 612, exposed light transducer 106 should have a frequency response similar to scotopic curve 612. If this is not practical, exposed light transducer 106 should at least have an attenuated infrared response. This is increasingly more important as high intensity discharge (HID) headlamps, which emit more bluish light than do incandescent or halogen lamps, gain in popularity.

Figure 32:
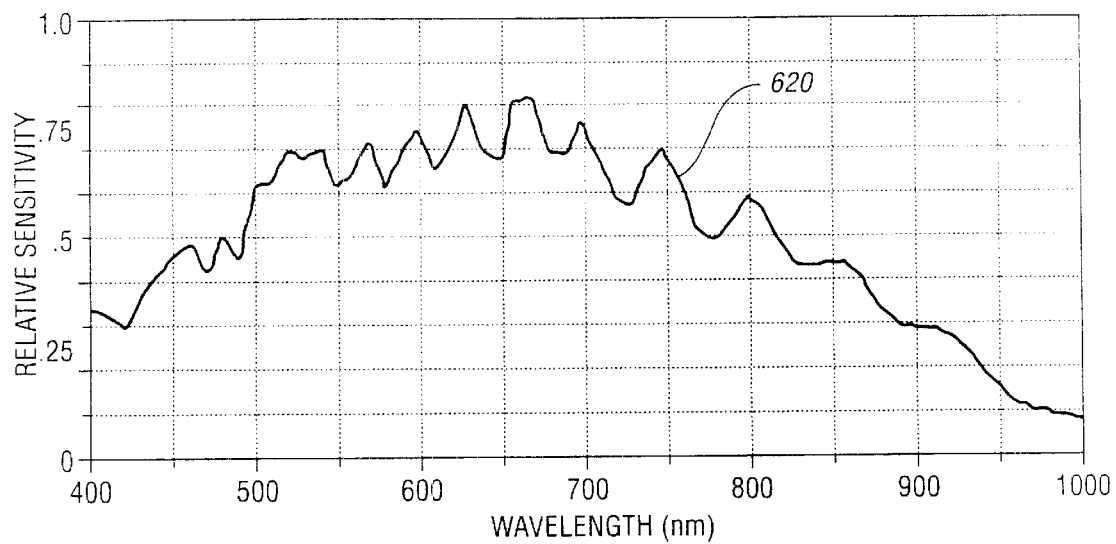
FIG. 32 is a graph illustrating frequency response of a typical light transducer.

Referring now to FIG. 32, a graph illustrating frequency response of a typical light transducer is shown. The relative frequency response of a typical photodiode is shown as curve 620. When compared to scotopic response curve 612, the frequency response of exposed light transducer 106 contains significantly more infrared sensitivity. As described with regards to FIG. 2 above, filter 58, 60 may be placed before or incorporated into sensor 48, 52 so that the output of exposed light transducer 106 more closely resembles scotopic frequency response 612 of the human eye.

Figure 33:
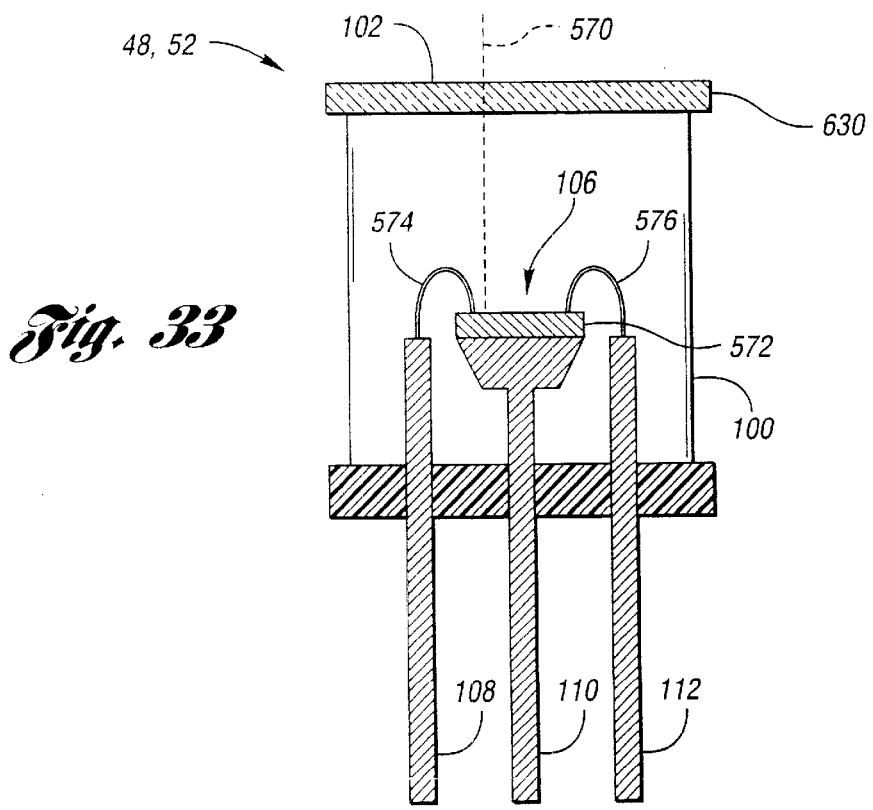
FIG. 33 is a drawing of an enclosure incorporating an infrared filter according to an embodiment of the present invention.

Referring now to FIG. 33, a drawing of an enclosure incorporating an infrared filter according to an embodiment of the present invention is shown. Window 102 in enclosure 100 includes infrared filter 630 operative to attenuate infrared components of light rays 570 striking exposed light transducer 106. Infrared filter 630 may be a hot mirror available from Optical Coating Laboratories, Inc. of Santa Rosa, Calif. A lens, such as described with regards to FIGS. 28–30 above, may be placed in front of infrared filter 630. Additional filtering for exposed light transducer 106 is described in U.S. Pat. No. 4,799,768 entitled "AUTOMATIC REARVIEW MIRROR WITH FILTERED LIGHT SENSORS" to Gahan, which is incorporated herein by reference.

While embodiments of the invention have been illustrated and described, it is not intended that these embodiments illustrate and describe all possible forms of the invention. Rather, it is intended that the following claims cover all modifications and alternative designs, and all equivalents, that fall within the spirit and scope of this invention.

The invention claimed is:

1. A light sensor comprising:
   a photodiode light transducer exposed to light, the exposed light transducer operative to accumulate charge in proportion to light incident over a predetermined integration period; and
   a sensor logic in communication with the exposed light transducer, the sensor logic operative to:
   (a) reset the charge accumulated in the exposed light transducer at the beginning of the predetermined light integration period, (b) measure the charge accumulated by the exposed light transducer over the predetermined light integration period, and (c) determine a pulse having a width based on the measured accumulated exposed light transducer charge.

2. The light sensor of claim 1, wherein the predetermined integration period is variable, and said sensor logic determines the duration of the predetermined integration period prior to the beginning of charge accumulation during the predetermined integration period.

3. The light sensor of claim 1 further comprising a comparator with one input connected to the exposed light transducer and the other input connected to a switched capacitor circuit, the switched capacitor circuit operable to charge a capacitor to a fixed voltage when the switch is closed and to discharge the capacitor at a constant rate when the switch is open, wherein the sensor logic is further operative to close the switch during the predetermined light integration period and open the switch after the predetermined light integration period, thereby creating the pulse at the comparator output.

4. The light sensor of claim 3 further comprising a second comparator with one input connected to a fixed voltage and the other input connected to the switched capacitor circuit, the second comparator output operative to inhibit output of the determined pulse if the ramp voltage is less than the fixed voltage.

5. The light sensor of claim 1 further comprising a photodiode light transducer shielded from light, the shielded light transducer operative to accumulate charge in proportion to noise over the predetermined integration period, wherein the sensor logic is further operative to:

reset the charge accumulated in the shielded light transducer at the beginning of the predetermined light integration period;

measure the charge accumulated by the shielded light transducer over the predetermined light integration period; and determine an output pulse having a width based on the difference between the measured accumulated exposed light transducer charge and the measured accumulated shielded light transducer charge.

6. The light sensor of claim 5, wherein the light sensor has an input for receiving an integration signal and wherein the noise is dependent on the light sensor temperature, the sensor logic further operable to:

determine an integration period based on the integration signal; and output the output pulse after a time length following the end of the integration signal, the time length based on the noise level, the time length thereby indicating the light sensor temperature.

7. The light sensor of claim 1, wherein the sensor logic determines the predetermined integration period from the asserted portion of a control signal received by the sensor logic.

8. The light sensor of claim 1, wherein the sensor logic is operative to determine each predetermined integration period by cycling through a sequence of predetermined time periods.

9. The light sensor of claim 1 further comprising at least one additional exposed photodiode light transducer, each additional exposed light transducer operative to accumulate charge in proportion to light incident over an integration period at a rate different than the rate of any other exposed light transducer, the sensor logic further operative to:

reset the charge accumulated in each of the at least one additional exposed light transducer at the beginning of the predetermined integration period;

measure the charge accumulated by each of the at least one additional exposed light transducer over the predetermined integration period; and output a pulse having a width based on the measured accumulated charge for each of the at least one additional exposed light transducer.

10. The light sensor of claim 9, wherein each exposed light transducer has a different collector area thereby having a different charge accumulation rate.

11. The light sensor of claim 9, wherein each exposed light transducer has an aperture for admitting light incident on the sensor, each sensor aperture having a different admitting area thereby giving each exposed light transducer a different charge accumulation rate.

12. The light sensor of claim 1, wherein the light transducer comprises:

a photodiode overlaying a substrate, the photodiode operative to accumulate incident charge in a photodiode well formed in a region of the substrate underlying the photodiode, the photodiode having an intrinsic photodiode capacitance;

a floating diffusion formed in the substrate, the floating diffusion having a diffusion well formed in a region of the substrate underlying the floating diffusion when the charge is reset, the floating diffusion operative to eliminate charge in the diffusion well when the charge is reset, the floating diffusion charge determining an output potential, the floating diffusion having an intrinsic floating diffusion capacitance; and a transmission gate between the photodiode and the floating diffusion, the transmission gate defining a transmission well formed in a region of the substrate between the region of the substrate underlying the photodiode and the region of the substrate underlying the floating diffusion, the transmission well having a depth shallower than the photodiode well and the diffusion well, the transmission gate having an intrinsic transmission gate capacitance;

wherein, when the charge is reset, charge in the photodiode well above the depth of the transmission well flows through the transmission well, through the floating diffusion, and is eliminated; and wherein, during the predetermined integration period, charge produced by light incident on the photodiode flows through the transmission well and into the diffusion well, producing output voltage inversely proportional to the floating diffusion capacitance, until the diffusion well is filled to the depth of the transmission well wherein charge produced by light incident on the photodiode fills the photodiode well, the transmission well, and the diffusion well, producing output voltage inversely proportional to the sum of the floating diffusion capacitance, the photodiode capacitance, and the transmission gate capacitance;

thereby providing a first sensitivity during charge accumulation in the diffusion well only and a second sensitivity during charge accumulation in the diffusion well, the transmission well, and the photodiode well, the first sensitivity greater than the second sensitivity.

13. The light sensor as in claim 12 further comprising an anti-bloom gate between the photodiode and a source voltage diffusion, the anti-bloom gate defining an anti-blooming well formed in a region of the substrate between the region of the substrate underlying the photodiode and the source voltage diffusion, the anti-blooming well having a depth shallower than the transmission well.

14. A light sensor package comprising:
an encapsulant having a lens for receiving light, the encapsulant admitting a power pin, a ground pin, and an output pin;
an exposed photodiode light transducer disposed within the encapsulant, the exposed light transducer operative to accumulate charge in proportion to light received through the lens incident on the exposed light transducer over an integration period;
a light-to-voltage circuit disposed within the encapsulant and in communication with the exposed light transducer, the light-to-voltage circuit operative to output a light voltage signal based on charge accumulated by the exposed light transducer; and
a voltage-to-pulse circuit disposed within the encapsulant and in communication with the light-to-voltage circuit, the voltage-to-pulse circuit operative to output a pulse on the output pin, the pulse width based on the light voltage signal.

15. The light sensor package of claim 14 further comprising:
a photodiode light transducer shielded from light, the shielded light transducer having the same construction as the exposed light transducer, the shielded light transducer operative to accumulate charge in proportion to noise over the integration period; and
a noise-to-voltage circuit disposed within the encapsulant and in communication with the shielded light transducer, the noise-to-voltage circuit operative to output a noise voltage signal based on charge accumulated by the shielded light transducer;
wherein the voltage-to-pulse circuit is operative to output a pulse on the output pin having a pulse width based on the difference between the light voltage signal and the noise voltage signal.

16. The light sensor package of claim 14 further comprising a sensor logic disposed within the encapsulant and in communication with an exposed light transducer and the light-to-voltage circuit, the sensor logic operative to:
determine a light integration period;
reset the charge accumulated in the exposed light transducer at the beginning of the determined light integration period; and
control the accumulation of charge by the exposed light transducer during the determined light integration period.

17. The light sensor package of claim 16 wherein the sensor logic is operative to determine the light integration period from the asserted portion of a control signal received on the output pin.

18. The light sensor package of claim 16 wherein the sensor logic is operative to determine each light integration period by cycling through a sequence of predetermined time periods.

19. The light sensor package of claim 16 further comprising at least one additional exposed photodiode light transducer, each additional exposed light transducer operative to accumulate charge in proportion to light incident over an integration period at a rate different than the rate of any other exposed light transducer, the sensor logic further operative to:
reset the charge accumulated in the at least one additional exposed light transducer at the beginning of the determined light integration period;
measure the charge accumulated by the at least one additional exposed light transducer over the determined light integration period; and
output a pulse having a width based on the measured accumulated charge for each of the at least one additional exposed light transducer.

20. The light sensor package of claim 19 wherein each exposed light transducer has a different collector area thereby having a different charge accumulation rate.

21. The light sensor package of claim 19 wherein each exposed light transducer has an aperture for admitting light incident on the sensor, each sensor aperture having a different admitting area thereby giving each exposed light transducer a different charge accumulation rate.

22. The light sensor package of claim 14, wherein the power pin, ground pin, and output pin are formed from a leadframe having a component support surface on which the photodiode light transducer, light-to-voltage circuit and the voltage-to-pulse circuit are mounted, the component support surface disposed at one end of one of the power, ground and output pins.

23. The light sensor package of claim 22, wherein the encapsulant encapsulates the photodiode light transducer, light-to-voltage circuit and the voltage-to-pulse circuit on the component support surface and retains the power, ground and output pins.

24. A light sensor package comprising:
an encapsulant having a lens for receiving light, the encapsulant admitting a power pin, a ground pin, and a communication pin;
an exposed photodiode light transducer disposed within the encapsulant, the exposed light transducer operative to accumulate charge in proportion to light received through the lens incident on the exposed light transducer over an integration period; and
a light-to-voltage circuit disposed within the encapsulant and in communication with the exposed light transducer, the light-to-voltage circuit operative to output a light voltage signal based on charge accumulated by the exposed light transducer,
wherein the integration period being determined from an asserted portion of a control signal received on the communication pin.

25. The light sensor package of claim 24 further comprising a voltage-to-pulse circuit disposed within the encapsulant and in communication with the light-to-voltage circuit, the voltage-to-pulse circuit operative to output a pulse on the communication pin, the pulse width based on the light voltage signal.

26. The light sensor package of claim 24 further comprising a sensor logic disposed within the encapsulant and in communication with exposed light transducer and the light-to-voltage circuit, the sensor logic operative to:
determine a light integration period from the asserted portion of the control signal received on the communication pin;
reset the charge accumulated in the exposed light transducer at the beginning of the determined light integration period; and
control the accumulation of charge by the exposed light transducer during the determined light integration period.

* * * * *